US 6,589,856 B2

(12) United States Patent
Curless

(10) Patent No.: US 6,589,856 B2
(45) Date of Patent: Jul. 8, 2003

(54) METHOD AND APPARATUS FOR CONTROLLING ANTI-PHASE DOMAINS IN SEMICONDUCTOR STRUCTURES AND DEVICES

(75) Inventor: Jay A. Curless, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/921,905

(22) Filed: Aug. 6, 2001

(65) Prior Publication Data

US 2003/0027408 A1 Feb. 6, 2003

(51) Int. Cl.[7] ............................................... H01L 21/36
(52) U.S. Cl. ....................................... 438/479; 438/517
(58) Field of Search .................................. 438/479, 517

(56) References Cited

U.S. PATENT DOCUMENTS 3,670,213 A    6/1972    Nakawaga et al.

(List continued on next page.)

FOREIGN PATENT DOCUMENTS

| DE | 196 07 107 | 8/1997 |
|----|------------|--------|
| DE | 197 12 496 | 10/1997 |
| DE | 100 17 137 | 10/2000 |
| EP | 0 250 171 | 12/1987 |
| EP | 0 309 270 | 3/1989 |
| EP | 0 331 467 | 9/1989 |
| EP | 0 342 937 | 11/1989 |
| EP | 3-41783 | 2/1991 |
| EP | 0 455 526 | 6/1991 |
| EP | 0 483 993 | 5/1992 |
| EP | 0 514 018 | 11/1992 |
| EP | 0 538 611 | 4/1993 |
| EP | 0 581 239 | 2/1994 |
| EP | 0 602 568 | 6/1994 |

(List continued on next page.)

OTHER PUBLICATIONS

P. J. Borrelli et al Composition and Structural Properties of Sputteres PLZT Thin Films Ferroelectric Thin Films II Symposium pp. 417–421, conference Dec. 1991, Published 1992 by Research Society, Pittsburgh PA, (dialog abstract only).*

(List continued on next page.)

*Primary Examiner*—Carl Whitehead, Jr.
*Assistant Examiner*—David S Blum
(74) *Attorney, Agent, or Firm*—Oblon, Spivak, McClelland, Maier & Neustadt, P.C.

(57) ABSTRACT

High quality epitaxial layers of monocrystalline materials can be grown overlying monocrystalline substrates such as large silicon wafers by forming a compliant substrate for growing the monocrystalline layers. An accommodating buffer layer comprises a layer of monocrystalline oxide spaced apart from a silicon wafer by an amorphous interface layer of silicon oxide. The amorphous interface layer dissipates strain and permits the growth of a high quality monocrystalline oxide accommodating buffer layer. The accommodating buffer layer has a lattice registry to both the underlying silicon wafer and the overlying monocrystalline material layer. Any lattice mismatch between the accommodating buffer layer and the underlying silicon substrate is taken care of by the amorphous interface layer. In addition, formation of a compliant substrate may include utilizing surfactant enhanced epitaxy, epitaxial growth of single crystal silicon onto single crystal oxide, and epitaxial growth of Zintl phase materials. The layers of the semiconductor structure may be manufactured in such a way as to control the formation of anti-phase domains so that the structure may operate without the deleterious effects associated with such defects. Such manufacture may include heat treating the substrate to essentially or completely eliminate single steps (anti-phase domains) by forming double steps that can transfer to the oxide interface layer and suppress the formation of anti-phase domains by forming double step therein, in preference to single steps.

8 Claims, 9 Drawing Sheets

U.S. PATENT DOCUMENTS

| | | |
|---|---|---|
| 3,766,370 A | 10/1973 | Walther |
| 3,802,967 A | 4/1974 | Ladany et al. |
| 3,914,137 A | 10/1975 | Huffman et al. |
| 3,935,031 A | 1/1976 | Adler |
| 4,006,989 A | 2/1977 | Andringa |
| 4,084,130 A | 4/1978 | Holton |
| 4,174,422 A | 11/1979 | Matthews et al. |
| 4,242,595 A | 12/1980 | Lehovec |
| 4,284,329 A | 8/1981 | Smith et al. |
| 4,289,920 A | 9/1981 | Hovel |
| 4,297,656 A | 10/1981 | Pan |
| 4,392,297 A | 7/1983 | Little |
| 4,398,342 A | 8/1983 | Pitt et al. |
| 4,404,265 A | 9/1983 | Manasevit |
| 4,424,589 A | 1/1984 | Thomas et al. |
| 4,439,014 A | 3/1984 | Stacy et al. |
| 4,442,590 A | 4/1984 | Stockton et al. |
| 4,452,720 A | 6/1984 | Harada et al. |
| 4,459,325 A | 7/1984 | Nozawa et al. |
| 4,482,422 A | 11/1984 | McGinn et al. |
| 4,482,906 A | 11/1984 | Hovel et al. |
| 4,484,332 A | 11/1984 | Hawrylo |
| 4,523,211 A | 6/1985 | Morimoto et al. |
| 4,594,000 A | 6/1986 | Falk et al. |
| 4,629,821 A | 12/1986 | Bronstein-Bonte et al. |
| 4,661,176 A | 4/1987 | Manasevit |
| 4,667,088 A | 5/1987 | Kramer et al. |
| 4,667,212 A | 5/1987 | Nakamura |
| 4,681,982 A | 7/1987 | Yoshida |
| 4,748,485 A | 5/1988 | Vasudev |
| 4,756,007 A | 7/1988 | Qureshi et al. |
| 4,772,929 A | 9/1988 | Manchester |
| 4,773,063 A | 9/1988 | Hunsperger et al. |
| 4,774,205 A | 9/1988 | Choi et al. |
| 4,777,613 A | 10/1988 | Shahan et al. |
| 4,793,872 A | 12/1988 | Meunier et al. |
| 4,802,182 A | 1/1989 | Thornton et al. |
| 4,815,084 A | 3/1989 | Scifres et al. |
| 4,841,775 A | 6/1989 | Ikeda et al. |
| 4,845,044 A | 7/1989 | Ariyoshi et al. |
| 4,846,926 A | 7/1989 | Kay et al. |
| 4,855,249 A | 8/1989 | Akasaki et al. |
| 4,885,376 A | 8/1989 | Akasake |
| 4,868,376 A | 9/1989 | Lessin et al. |
| 4,876,208 A | 10/1989 | Gustafson et al. |
| 4,876,219 A | 10/1989 | Eshita et al. |
| 4,882,300 A | 11/1989 | Inoue et al. |
| 4,888,202 A | 12/1989 | Murakami et al. |
| 4,889,402 A | 12/1989 | Reinhart |
| 4,891,091 A | 1/1990 | Shastry |
| 4,896,194 A | 1/1990 | Suzuki |
| 4,901,133 A | 2/1990 | Curran et al. |
| 4,910,164 A | 3/1990 | Shichijo |
| 4,912,087 A | 3/1990 | Aslam et al. |
| 4,928,154 A | 5/1990 | Umeno et al. |
| 4,952,420 A | 8/1990 | Walters |
| 4,963,508 A | 10/1990 | Umeno et al. |
| 4,963,949 A | 10/1990 | Wanlass et al. |
| 4,965,649 A | 10/1990 | Zanio et al. |
| 4,984,043 A | 1/1991 | Vinal |
| 4,999,842 A | 3/1991 | Huang et al. |
| 5,028,976 A | 7/1991 | Ozaki et al. |
| 5,051,790 A | 9/1991 | Hammer |
| 5,053,835 A | 10/1991 | Horikawa et al. |
| 5,055,445 A | 10/1991 | Belt et al. |
| 5,060,031 A | 10/1991 | Abrokwah et al. |
| 5,063,081 A | 11/1991 | Cozzette et al. |
| 5,063,166 A | 11/1991 | Mooney et al. |
| 5,067,809 A | 11/1991 | Tsubota |
| 5,073,981 A | 12/1991 | Giles et al. |
| 5,081,062 A | 1/1992 | Vasudev et al. |
| 5,081,519 A | 1/1992 | Nishimura |
| 5,103,494 A | 4/1992 | Mozer |
| 5,116,461 A | 5/1992 | Lebby et al. |
| 5,127,067 A | 6/1992 | Delcoco et al. |
| 5,130,762 A | 7/1992 | Kulick |
| 5,132,648 A | 7/1992 | Trinh et al. |
| 5,140,651 A | 8/1992 | Soref et al. |
| 5,141,894 A | 8/1992 | Bisaro et al. |
| 5,143,854 A | 9/1992 | Pirrung et al. |
| 5,144,409 A | 9/1992 | Ma |
| 5,155,658 A | 10/1992 | Inam et al. |
| 5,159,413 A | 10/1992 | Calviello et al. |
| 5,163,118 A | 11/1992 | Lorenzo et al. |
| 5,173,474 A | 12/1992 | Connell et al. |
| 5,185,589 A | 2/1993 | Krishnaswamy et al. |
| 5,191,625 A | 3/1993 | Gustavsson |
| 5,194,397 A | 3/1993 | Cook et al. |
| 5,198,269 A | 3/1993 | Swartz et al. |
| 5,208,182 A | 5/1993 | Narayan et al. |
| 5,210,763 A | 5/1993 | Lewis et al. |
| 5,216,729 A | 6/1993 | Berger et al. |
| 5,221,367 A | 6/1993 | Chisholm et al. |
| 5,225,031 A | 7/1993 | McKee et al. |
| 5,227,196 A | 7/1993 | Itoh |
| 5,244,818 A | 9/1993 | Jokerst et al. |
| 5,248,564 A | 9/1993 | Ramesh |
| 5,260,394 A | 11/1993 | Tazaki et al. |
| 5,266,355 A | 11/1993 | Wernberg et al. |
| 5,270,298 A | 12/1993 | Ramesh |
| 5,280,013 A | 1/1994 | Newman et al. |
| 5,281,834 A | 1/1994 | Cambou et al. |
| 5,286,985 A | 2/1994 | Taddiken |
| 5,293,050 A | 3/1994 | Chapple-Sokol et al. |
| 5,306,649 A | 4/1994 | Hebert |
| 5,310,707 A | 5/1994 | Oishi et al. |
| 5,312,765 A | 5/1994 | Kanber |
| 5,314,547 A | 5/1994 | Heremans et al. |
| 5,323,023 A | 6/1994 | Fork |
| 5,326,721 A | 7/1994 | Summerfelt |
| 5,334,556 A | 8/1994 | Guldi |
| 5,352,926 A | 10/1994 | Andrews |
| 5,356,509 A | 10/1994 | Terranova et al. |
| 5,356,831 A | 10/1994 | Calviello et al. |
| 5,357,122 A | 10/1994 | Okubora et al. |
| 5,358,925 A | 10/1994 | Neville Connell et al. |
| 5,371,734 A | 12/1994 | Fischer |
| 5,372,992 A | 12/1994 | Itozaki et al. |
| 5,391,515 A | 2/1995 | Kao et al. |
| 5,393,352 A | 2/1995 | Summerfelt |
| 5,394,489 A | 2/1995 | Koch |
| 5,395,663 A | 3/1995 | Tabata et al. |
| 5,397,428 A | 3/1995 | Stoner et al. |
| 5,399,898 A | 3/1995 | Rostoker |
| 5,404,581 A | 4/1995 | Honjo |
| 5,405,802 A | 4/1995 | Yamagata et al. |
| 5,406,202 A | 4/1995 | Mehrgardt et al. |
| 5,418,216 A | 5/1995 | Fork |
| 5,418,389 A | 5/1995 | Watanabe |
| 5,420,102 A | 5/1995 | Harshavardhan et al. |
| 5,436,759 A | 7/1995 | Dijaili et al. |
| 5,441,577 A | 8/1995 | Sasaki et al. |
| 5,442,191 A | 8/1995 | Ma |
| 5,442,561 A | 8/1995 | Yoshizawa et al. |
| 5,444,016 A | 8/1995 | Abrokwah et al. |
| 5,450,812 A | 9/1995 | McKee et al. |
| 5,453,727 A | 9/1995 | Shibasaki et al. |
| 5,466,631 A | 11/1995 | Ichikawa et al. |
| 5,473,047 A | 12/1995 | Shi |
| 5,473,171 A | 12/1995 | Nishi et al. |
| 5,478,653 A | 12/1995 | Guenzer |

| Patent No. | Date | Inventor |
|---|---|---|
| 5,479,033 A | 12/1995 | Baca et al. |
| 5,479,317 A | 12/1995 | Ramesh |
| 5,480,829 A | 1/1996 | Abrokwah et al. |
| 5,481,102 A | 1/1996 | Hazelrigg, Jr. |
| 5,482,003 A | 1/1996 | McKee et al. |
| 5,484,664 A | 1/1996 | Kitahara et al. |
| 5,486,406 A | 1/1996 | Shi |
| 5,491,461 A | 2/1996 | Partin et al. |
| 5,492,859 A | 2/1996 | Sakaguchi et al. |
| 5,494,711 A | 2/1996 | Takeda et al. |
| 5,504,035 A | 4/1996 | Rostoker et al. |
| 5,504,183 A | 4/1996 | Shi et al. |
| 5,511,238 A | 4/1996 | Bayraktaroglu |
| 5,512,773 A | 4/1996 | Wolf et al. |
| 5,514,484 A | 5/1996 | Nashimoto |
| 5,514,904 A | 5/1996 | Onga et al. |
| 5,515,047 A | 5/1996 | Yamakido et al. |
| 5,515,810 A | 5/1996 | Yamashita |
| 5,516,725 A | 5/1996 | Chang et al. |
| 5,519,235 A | 5/1996 | Ramesh |
| 5,528,057 A | 6/1996 | Yanagase et al. |
| 5,528,067 A | 6/1996 | Farb |
| 5,528,414 A | 6/1996 | Oakley |
| 5,530,235 A | 6/1996 | Stefik et al. |
| 5,538,941 A | 7/1996 | Findikoglu et al. |
| 5,541,422 A | 7/1996 | Wolf et al. |
| 5,549,977 A | 8/1996 | Jin et al. |
| 5,551,238 A | 9/1996 | Prueitt |
| 5,552,547 A | 9/1996 | Shi |
| 5,553,089 A | 9/1996 | Seki et al. |
| 5,556,463 A * | 9/1996 | Guenzer ............... 117/90 |
| 5,569,953 A | 10/1996 | Kikkawa et al. |
| 5,572,052 A | 11/1996 | Kashihara et al. |
| 5,576,879 A | 11/1996 | Nashimoto |
| 5,588,995 A | 12/1996 | Sheldon |
| 5,589,284 A | 12/1996 | Summerfelt et al. |
| 5,596,205 A | 1/1997 | Reedy et al. |
| 5,596,214 A | 1/1997 | Endo |
| 5,602,418 A | 2/1997 | Imai et al. |
| 5,603,764 A | 2/1997 | Matsuda et al. |
| 5,606,184 A | 2/1997 | Abrokwah et al. |
| 5,608,046 A | 3/1997 | Cook et al. |
| 5,610,744 A | 3/1997 | Ho et al. |
| 5,614,739 A | 3/1997 | Abrokwah et al. |
| 5,619,051 A | 4/1997 | Endo |
| 5,621,227 A | 4/1997 | Joshi |
| 5,623,552 A | 4/1997 | Lane |
| 5,629,534 A | 5/1997 | Inuzuka et al. |
| 5,633,724 A | 5/1997 | King et al. |
| 5,640,267 A | 6/1997 | May et al. |
| 5,650,646 A | 7/1997 | Summerfelt |
| 5,656,382 A | 8/1997 | Nashimoto |
| 5,659,180 A | 8/1997 | Shen et al. |
| 5,661,112 A | 8/1997 | Hatta |
| 5,670,798 A | 9/1997 | Schetzina |
| 5,670,800 A | 9/1997 | Nakao et al. |
| 5,674,366 A | 10/1997 | Hayashi et al. |
| 5,679,965 A | 10/1997 | Schetzina |
| 5,689,123 A | 11/1997 | Major et al. |
| 5,729,394 A | 3/1998 | Sevier et al. |
| 5,729,641 A | 3/1998 | Chandonnet et al. |
| 5,731,220 A | 3/1998 | Tsu et al. |
| 5,733,641 A | 3/1998 | Fork et al. |
| 5,734,672 A | 3/1998 | McMinn et al. |
| 5,735,949 A | 4/1998 | Mantl et al. |
| 5,741,724 A | 4/1998 | Ramdani et al. |
| 5,745,631 A | 4/1998 | Reinker |
| 5,753,300 A * | 5/1998 | Wessels et al. ............ 427/126.3 |
| 5,753,928 A | 5/1998 | Krause |
| 5,754,319 A | 5/1998 | Van De Voorde et al. |
| 5,760,426 A | 6/1998 | Marx et al. |
| 5,764,676 A | 6/1998 | Paoli et al. |
| 5,767,543 A | 6/1998 | Ooms et al. |
| 5,770,887 A | 6/1998 | Tadatomo et al. |
| 5,776,359 A | 7/1998 | Schultz et al. |
| 5,776,621 A | 7/1998 | Nashimoto |
| 5,777,350 A | 7/1998 | Nakamura et al. |
| 5,777,762 A | 7/1998 | Yamamoto |
| 5,778,018 A | 7/1998 | Yoshikawa et al. |
| 5,778,116 A | 7/1998 | Tomich |
| 5,780,311 A | 7/1998 | Beasom et al. |
| 5,789,733 A | 8/1998 | Jachimowicz et al. |
| 5,789,845 A | 8/1998 | Wadaka et al. |
| 5,790,583 A | 8/1998 | Ho |
| 5,792,569 A | 8/1998 | Sun et al. |
| 5,792,679 A | 8/1998 | Nakato |
| 5,801,072 A | 9/1998 | Barber |
| 5,801,105 A | 9/1998 | Yano et al. |
| 5,807,440 A | 9/1998 | Kubota et al. |
| 5,810,923 A | 9/1998 | Yano et al. |
| 5,812,272 A | 9/1998 | King et al. |
| 5,814,583 A | 9/1998 | Itozaki et al. |
| 5,825,055 A | 10/1998 | Summerfelt |
| 5,825,799 A | 10/1998 | Ho et al. |
| 5,827,755 A | 10/1998 | Yonehara et al. |
| 5,828,080 A | 10/1998 | Yano et al. |
| 5,830,270 A | 11/1998 | McKee et al. |
| 5,834,362 A | 11/1998 | Miyagaki et al. |
| 5,838,035 A | 11/1998 | Ramesh |
| 5,844,260 A | 12/1998 | Ohori |
| 5,846,846 A | 12/1998 | Suh et al. |
| 5,857,049 A | 1/1999 | Beranek et al. |
| 5,858,814 A | 1/1999 | Goossen et al. |
| 5,861,966 A | 1/1999 | Ortel |
| 5,863,326 A | 1/1999 | Nause et al. |
| 5,869,845 A | 2/1999 | Vander Wagt et al. |
| 5,872,493 A | 2/1999 | Ella |
| 5,873,977 A | 2/1999 | Desu et al. |
| 5,874,860 A | 2/1999 | Brunel et al. |
| 5,879,956 A | 3/1999 | Seon et al. |
| 5,880,452 A | 3/1999 | Plesko |
| 5,883,564 A | 3/1999 | Partin |
| 5,883,996 A | 3/1999 | Knapp et al. |
| 5,886,867 A * | 3/1999 | Chivukula et al. .......... 361/311 |
| 5,888,296 A | 3/1999 | Ooms et al. |
| 5,907,792 A | 5/1999 | Droopad et al. |
| 5,912,068 A | 6/1999 | Jia |
| 5,926,493 A | 7/1999 | O'Brien et al. |
| 5,926,496 A | 7/1999 | Ho et al. |
| 5,937,274 A | 8/1999 | Kondow et al. |
| 5,937,285 A | 8/1999 | Abrokwah et al. |
| 5,948,161 A | 9/1999 | Kizuki |
| 5,955,591 A | 9/1999 | Imbach et al. |
| 5,959,879 A | 9/1999 | Koo |
| 5,962,069 A | 10/1999 | Schindler et al. |
| 5,963,291 A | 10/1999 | Wu et al. |
| 5,966,323 A | 10/1999 | Chen et al. |
| 5,977,567 A | 11/1999 | Verdiell |
| 5,981,400 A | 11/1999 | Lo |
| 5,984,190 A | 11/1999 | Nevill |
| 5,987,011 A | 11/1999 | Toh |
| 5,990,495 A | 11/1999 | Ohba |
| 5,995,359 A | 11/1999 | Klee et al. |
| 6,002,375 A | 12/1999 | Corman et al. |
| 6,008,762 A | 12/1999 | Nghiem |
| 6,011,641 A | 1/2000 | Shin et al. |
| 6,011,646 A | 1/2000 | Mirkarimi et al. |
| 6,020,222 A | 2/2000 | Wollesen |
| 6,022,140 A | 2/2000 | Fraden et al. |
| 6,022,410 A | 2/2000 | Yu et al. |
| 6,022,963 A | 2/2000 | McGall et al. |
| 6,023,082 A | 2/2000 | McKee et al. |

| | | | | | | |
|---|---|---|---|---|---|---|
| 6,028,853 | A | 2/2000 | Haartsen | 6,306,668 B1 | 10/2001 | McKee et al. |
| 6,039,803 | A | 3/2000 | Fitzgerald et al. | 6,313,486 B1 | 11/2001 | Kencke et al. |
| 6,045,626 | A * | 4/2000 | Yano et al. ............... 438/479 | 6,316,785 B1 | 11/2001 | Nunoue et al. |
| 6,046,464 | A | 4/2000 | Schetzina | 6,316,832 B1 | 11/2001 | Tsuzuki et al. |
| 6,048,751 | A | 4/2000 | D'Asaro et al. | 6,326,645 B1 | 12/2001 | Kadota |
| 6,049,702 | A | 4/2000 | Tham et al. | 6,338,756 B2 | 1/2002 | Dietze |
| 6,055,179 | A | 4/2000 | Koganei et al. | 6,339,664 B1 | 1/2002 | Farjady et al. |
| 6,058,131 | A | 5/2000 | Pan | 6,340,788 B1 | 1/2002 | King et al. |
| 6,064,078 | A | 5/2000 | Northrup et al. | 6,343,171 B1 | 1/2002 | Yoshimura et al. |
| 6,064,092 | A | 5/2000 | Park | 6,345,424 B1 | 2/2002 | Hasegawa et al. |
| 6,078,717 | A | 6/2000 | Nashimoto et al. | 6,348,373 B1 | 2/2002 | Ma et al. |
| 6,083,697 | A | 7/2000 | Beecher et al. | 6,359,330 B1 | 3/2002 | Goudard |
| 6,087,681 | A | 7/2000 | Shakuda | 6,362,017 B1 | 3/2002 | Manabe et al. |
| 6,088,216 | A | 7/2000 | Laibowitz et al. | 6,367,699 B2 | 4/2002 | Ackley |
| 6,090,659 | A | 7/2000 | Laibowitz et al. | 6,372,356 B1 | 4/2002 | Thornton et al. |
| 6,093,302 | A | 7/2000 | Montgomery | 6,372,813 B1 | 4/2002 | Johnson et al. |
| 6,096,584 | A | 8/2000 | Ellis-Monaghan et al. | 6,389,209 B1 | 5/2002 | Suhir |
| 6,103,008 | A | 8/2000 | McKee et al. | 6,391,674 B2 | 5/2002 | Ziegler |
| 6,107,653 | A | 8/2000 | Fitzgerald | 6,392,257 B1 | 5/2002 | Ramdani et al. |
| 6,107,721 | A | 8/2000 | Lakin | 6,410,941 B1 | 6/2002 | Taylor et al. |
| 6,108,125 | A | 8/2000 | Yano | 6,427,066 B1 | 7/2002 | Grube |
| 6,113,690 | A | 9/2000 | Yu et al. | 6,432,546 B1 | 8/2002 | Ramesh et al. |
| 6,114,996 | A | 9/2000 | Nghiem | 6,438,281 B1 | 8/2002 | Tsukamoto et al. |
| 6,121,642 | A | 9/2000 | Newns | 2001/0013313 A1 | 8/2001 | Droopad et al. |
| 6,121,647 | A | 9/2000 | Yano et al. | 2002/0008234 A1 | 1/2002 | Emrick |
| 6,128,178 | A | 10/2000 | Newns | 2002/0030246 A1 | 3/2002 | Eisenbeiser et al. |
| 6,134,114 | A | 10/2000 | Ungermann et al. | 2002/0047123 A1 | 4/2002 | Ramdani et al. |
| 6,136,666 | A | 10/2000 | So | 2002/0072245 A1 | 6/2002 | Ooms et al. |
| 6,137,603 | A | 10/2000 | Henmi | | | |
| 6,143,072 | A | 11/2000 | McKee et al. | FOREIGN PATENT DOCUMENTS | | |
| 6,143,366 | A | 11/2000 | Lu | EP | 0 607 435 | 7/1994 |
| 6,146,906 | A | 11/2000 | Inoue et al. | EP | 0 630 057 | 12/1994 |
| 6,150,239 | A | 11/2000 | Goesele et al. | EP | 0 682 266 | 11/1995 |
| 6,153,010 | A | 11/2000 | Kiyoku et al. | EP | 0 810 666 | 12/1997 |
| 6,153,454 | A | 11/2000 | Krivokapic | EP | 0 875 922 | 11/1998 |
| 6,156,581 | A | 12/2000 | Vaudo et al. | EP | 10-303396 | 11/1998 |
| 6,173,474 | B1 | 1/2001 | Conrad | EP | 10-321943 | 12/1998 |
| 6,174,755 | B1 | 1/2001 | Manning | EP | 0 926 739 | 6/1999 |
| 6,175,497 | B1 | 1/2001 | Tseng et al. | EP | 0 964 453 | 6/1999 |
| 6,175,555 | B1 | 1/2001 | Hoole | EP | 0 957 522 | 11/1999 |
| 6,180,252 | B1 | 1/2001 | Farrell et al. | EP | 0 964 259 | 12/1999 |
| 6,180,486 | B1 | 1/2001 | Leobandung et al. | EP | 0 999 600 | 5/2000 |
| 6,184,044 | B1 | 2/2001 | Sone et al. | EP | 1 001 468 | 5/2000 |
| 6,184,144 | B1 | 2/2001 | Lo | EP | 1 043 427 | 10/2000 |
| 6,191,011 | B1 | 2/2001 | Gilboa et al. | EP | 1 069 606 | 1/2001 |
| 6,197,503 | B1 | 3/2001 | Vo-Dinh et al. | EP | 1 109 212 | 6/2001 |
| 6,204,737 | B1 | 3/2001 | Ella | GB | 1 319 311 | 6/1970 |
| 6,208,453 | B1 * | 3/2001 | Wessels et al. ............ 359/321 | GB | 2 335 792 | 9/1999 |
| 6,210,988 | B1 | 4/2001 | Howe et al. | JP | 52-88354 | 7/1977 |
| 6,211,096 | B1 | 4/2001 | Allman et al. | JP | 52-89070 | 7/1977 |
| 6,222,654 | B1 | 4/2001 | Frigo | JP | 52 135684 | 11/1977 |
| 6,224,669 | B1 | 5/2001 | Yi et al. | JP | 54-134554 | 10/1979 |
| 6,225,051 | B1 | 5/2001 | Sugiyama et al. | JP | 55-87424 | 7/1980 |
| 6,229,159 | B1 | 5/2001 | Suzuki | JP | 58-213412 | 12/1983 |
| 6,235,145 | B1 | 5/2001 | Li et al. | JP | 60-212018 | 10/1985 |
| 6,235,649 | B1 | 5/2001 | Kawahara et al. | JP | 61-36981 | 2/1986 |
| 6,238,946 | B1 | 5/2001 | Ziegler | JP | 61-63015 | 4/1986 |
| 6,239,449 | B1 | 5/2001 | Fafard et al. | JP | 61-108187 | 5/1986 |
| 6,241,821 | B1 | 6/2001 | Yu et al. | JP | 63-34994 | 2/1988 |
| 6,242,686 | B1 | 6/2001 | Kishimoto et al. | JP | 63-131104 | 6/1988 |
| 6,248,459 | B1 | 6/2001 | Wang et al. | JP | 63-198365 | 8/1988 |
| 6,248,621 | B1 | 6/2001 | Wilk et al. | JP | 64-50575 | 2/1989 |
| 6,252,261 | B1 | 6/2001 | Usui et al. | JP | 64-52329 | 2/1989 |
| 6,255,198 | B1 | 7/2001 | Linthicum et al. | JP | 1-102435 | 4/1989 |
| 6,265,749 | B1 | 7/2001 | Gardner et al. | JP | 1-179411 | 7/1989 |
| 6,268,269 | B1 | 7/2001 | Lee et al. | JP | HEI 2-391 | 1/1990 |
| 6,271,619 | B1 | 8/2001 | Yamada et al. | JP | 02051220 | 2/1992 |
| 6,275,122 | B1 | 8/2001 | Speidell et al. | JP | 5-48072 | 2/1993 |
| 6,277,436 | B1 | 8/2001 | Stauf et al. | JP | 5-086477 | 4/1993 |
| 6,278,138 | B1 | 8/2001 | Suzuki | JP | 05150143 | 6/1993 |
| 6,291,319 | B1 | 9/2001 | Yu et al. | JP | 5-152529 | 6/1993 |

| | | |
|---|---|---|
| JP | 5-291299 | 11/1993 |
| JP | 6-232126 | 8/1994 |
| JP | 6-291299 | 10/1994 |
| JP | 6-334168 | 12/1994 |
| JP | 0812494 | 1/1996 |
| JP | 9-67193 * | 3/1997 ........... C30B/25/18 |
| JP | 9-82913 | 3/1997 |
| JP | 9 82913 * | 3/1997 ......... H01L/27/108 |
| JP | 10-256154 | 9/1998 |
| JP | 11135614 | 5/1999 |
| JP | 11-238683 | 8/1999 |
| JP | 11-260835 | 9/1999 |
| JP | 2 779 843 | 12/1999 |
| JP | 11340542 | 12/1999 |
| JP | 2000-068466 | 3/2000 |
| JP | 2 000 1645 | 6/2000 |
| JP | 2002-9366 | 1/2002 |
| WO | 60-210018 | 10/1985 |
| WO | WO 92/10875 | 6/1992 |
| WO | WO 93/07647 | 4/1993 |
| WO | WO 94/03908 | 2/1994 |
| WO | WO 97/45827 | 12/1997 |
| WO | WO 98/05807 | 1/1998 |
| WO | WO 99/14797 | 3/1999 |
| WO | WO 99/14804 | 3/1999 |
| WO | WO 99/19546 | 4/1999 |
| WO | WO 99/63580 | 12/1999 |
| WO | WO 00/03812 | 2/2000 |
| WO | WO 00/16378 | 3/2000 |
| WO | WO 00/33363 | 6/2000 |
| WO | WO 00/48239 | 8/2000 |
| WO | WO 01/33585 | 5/2001 |
| WO | WO 01/37330 | 5/2001 |
| WO | WO 01/59814 A2 | 8/2001 |
| WO | WO 01/59820 A1 | 8/2001 |
| WO | WO 02/03113 | 1/2002 |
| WO | WO 02/03467 | 1/2002 |
| WO | WO 02/09160 A2 | 1/2002 |
| WO | WO 02 01648 | 2/2002 |
| WO | WO 02/33385 A2 | 4/2002 |

OTHER PUBLICATIONS

G. J. M. Dormans et al PbTiO3 Thin Films Grown by Organometallic Vapour Deposition Third Symposium on Integrated Ferroelectrics pp. 297–310 conference Apr. 1991, Published 1992 by Journal of Integrated Ferroelectrics, UK (dialog abstract only).*

D.E. Aspnes et al; "Steps on (001) Silicon Surfaces"; J. Vac. Sci. Technol, B vol. 5, No. 4; Jul/Aug. 1987; pp. 940–944.

S.F. Fang et al; "Gallium Arsenide and Other Compound Semiconductors on Silicon"; J. Appl. Phys., vol. 68, No. 7, Oct. 1, 1990; pp. R31–R58.

Nakagawara et al., Effects of Buffer Layers in Epitaxial Growth of SrTiO₃ Thin Film on Si(100), *J. Appl. Phys.*, 78 (12), Dec. 15, 1995, pp. 7226–7230.

Suzuki et al., "A Proposal of Epitaxial Oxide Thin Film Structures For Future Oxide Electronics," *Materials Science and Engineering B41*, (1996), pp. 166–173.

W. F. Egelhoff et al., "Optimizing GMR Spin Valves: The Outlook for Improved Properties", *1998 Int'l Non Volatile Memory Technology Conference*, pp. 34–37.

Wang et al., "Processing and Performance of Piezoelectric Films", Univ. Of MD, Wilicoxon Research Col, and Motorola Labs, May 11, 2000.

M. Rotter et al., "Nonlinear Acoustoelectric Interactions in GaAs/LiNbo₃ Structures", *Applied Physics Letters*, vol. 75(7), Aug. 16, 1999, pp. 965–967.

K. Sreenivas et al., "Surface Acoustic Wave Propagation on Lead Zirconate Titanite Thin Films," *Appl. Phys. Lett.* 52 (9), Feb. 29, 1998, pp. 709–711.

M. Rotter et al., "Single Chip Fused Hybrids for Acousto–Electic and Acousto–Optic Applications," *Applied Physics Letters*, vol. 70(16), Apr. 21, 1997, pp. 2097–2099.

A. Mansingh et al., "Surface Acoustic Wave Propagation in PZT/YBCO/SriTiO₃ and PbTiO/YBCO/SrTiO₃ Epitaxial Heterostructures," *Ferroelectric*, vol. 224, pp. 275–282, 1999.

S. Mathews et al., "Ferroelectric Field Effect Transistor Based on Epitaxial Pervoskite Heterostructures", Science, vol. 276, Apr. 11, 1997, pp. 238–240.

R. Houdre et al., "Properties of GaAs on Si Grown by Molecular Beam Epitaxy," *Solid State of Materials Sciences*, vol. 16, Issue 2, 1990, pp. 91–114.

S. F. Fang et al., "Gallium Arsenide and Other Compound Semiconductors on Silicon," *J. Appl. Phys.*, 68(7), Oct. 1, 1990, pp. R31–R58.

Carlin et al., Impact of GaAs Buffer Thickness on Electronic Quality of GaAs Grown on Graded Ge/GeSi/Si Substrates, *Appl. Phys. Letter.* vol. 76, No. 14, Apr. 2000, pp. 1884–1886.

Ringel et al., "Epitaxial Integration if III–V Materials and Devices with Si Using Graded GeSi Buffers," $27^{th}$ International Symposium on Compound Semiconductors, Oct. 2000.

Zogg et al., "Progess in Compound–Semiconductor–on––Silicon–Heteroepitaxy with Fluoride Buffer Layers," *J. Electrochem Soc.*, vol. 136, No. 3, Mar. 1998, pp. 775–779.

Xiong et al., "Oxide Defines GaAs Vertical–Cavity Surface–Emitting Lasers on Si Substrates," *IEEE Photonics Technology Letters*, vol. 12, No. 2, Feb. 2000, pp. 110–112.

Clem et al., "Investigation of PZT//LSCO//Pt//Aerogel Thin Film Composites for Uncooled Pyroelectric IR Detectors," *Mat. Res. Soc. Symp. Proc.*, vol. 541, pp. 661–666, 1999.

Gunapala et al., "Bound–To–Quasi–Bound Quantum–Well Infrared Photodetectors," NASA Tech Brief, vol. 22, No. 9, Sep. 1998.

Abhay M. Joshi et al., "Monolithic InGaAs–on–silicon Wave Infrared Detector Arrays," *Intn. Society for Optical Engineering*, vol. 2999, pp. 211–224.

Bruley et al., "Nanostructure and Chemistry of a (100)MgO/(100) GaAs Interface," *Appl. Phys Lett*, 65(5), Aug. 1994, pp. 564–566.

Fork, et al., "Epitaxial MgO On Si(001) for Y–Ba–Cu–O Thin Film Growth by Pulsed Laser Deposition," *Appl. Phys Lett.*, 58(20), May 20, 1991, pp. 2294–2296.

Himpsel et al., "Dialectrics on Semiconductors," *Materials Science and Engineering*, N1(1988), pp. 9–13.

Li et al., "Epitaxial La $_{0.67}$Sr$_{0.33}$MnO₃ Magnetic Tunnel Junctions," *J. Appl. Phys.* 81(8), Apr. 15, 1997, pp. 5509–5511.

O'Donnell et al., "Colossal Magnetoresistance Magnetic Tunnel Junctions Grown by Molecular–Beam Epitaxy," *Appl. Physics Letters*, vol. 76, No. 14, Apr. 3, 2000, pp. 1914–1916.

Mikami et al., "Formation of Si Epi/MgO–Al₂O₃Epi./SiO₃/Si and Its Epitaxial Film Quality," Fundamental Research Laboratories and Microelectronics Laboratories, pp. 31–34, 1983.

T. Asano et al., "An Epitaxial Si/Insulator/Si Structure Prepared by Vacuum Deposition of CaF₂ and Silicon," *Thin Solid Films*, vol. 93 (1982), pp. 143–150.

T. Chikyow et al., "Reaction and Regrowth Control of CeO$_2$on Si(111) Surface for the Silicon–On Insulator Structure," *Appl. Phys. Lett.*, vol. 65, No. 8, Aug. 22, 1994, pp. 1030–1032.

J.F. Kang, et al., "Epitaxial Growth of CeO$_2$(100) Films on Si(100) Substrates by Dual Ion Beams Reactive Sputtering," *Solid State Communications*, vol. 108, No. 4, pp. 225–227, 1998.

R.A. Morgan et al., "Vertical–Cavity Surface–Emitting Lasers Come of Age," *SPIE*, vol. 2683, pp. 18–29.

"Technical Analysis of Qualcomm QCP–800 Portable Cellular Phone (Transmitter Circuitry)," Talus Corporation, Qualcomm QCP–800 Technical Analsis Report, Dec. 10, 1996, pp. 5–8.

Jo–Ey Wong, et al.; "An Electrostatically–Actuated Mems Switch for Power Applications"; IEEE, 2000; pp. 633–638.

T. Mizuno, et al.; "Electron and Hole Mobility Enhancement in Strained–Si MOSFET's on SiGe–on–Insulator Substrates Fabricated by SIMOX Technology"; IEEE Electron Device Letters, vol. 21. No. 5, May 2000; pp. 230–232.

F.M. Buffer, et al., "Strain–dependence of electron transport in bulk Si and deep–submicron MOSFET's" Computatural Electronics, 2000, Book of Abstracts, IWCE Glasgow 2000, 7$^{th}$ Int'l Workshop on, 2000; pp. 64–65.

S.S. Lu, et al.; "Piezoelectric field effect transistor (PEFET) using In$_{0.2}$Ga$_{0.8}$As/Al$_{0.2}$Ga$_{0.8}$As/GaAs Strained layer structure on (111)B GaAs substrate"; Electronics Letters, 12$^{th}$ Ma 1994, vol. 30, No. 10; pp. 823–825.

Kihong KIM, et al."On–Chip Wireless Interconnection with Integrated Antennas"; 2000 IEEE; pp. 20.2.1–20.3.4.

G. Passiopoulos, et al.; "V–Band Single Chip, Direct Carrier BPSK Modulation Transmitter with Integrated Patch Antenna"; 1998 IEEE MTT–S Digest; pp. 305–308.

Mau–Chung Frank Chang, et al.; "RF/Wireless Interconnect for Inter–and Intra–Chip Communications"; Proceedings of the IEEE, vol. 89, No. 4, Apr. 2001; pp. 456–466.

The Electronics Industry Report; Prismark; 2001; pp. 111–120.

J.K. Abrokwah, et al.; "A Manufacturable Complementary GaAs Process"; GaAs IC Symposium, IEEE, 1993; pp. 127–130.

H. Nagata, "Preliminary Consideration of the Growth Behaviour of CeO$_2$, SrTiO$_3$ and SrVO$_3$ Films on Si Substrate," *Thin Solid Films*, 224, 1993, pp. 1–3.

Nagata et al., "Heteroepitaxial Growth of CeO$_2$(001) Films on Si(001) Substrates by Pulsed Laser Deposition in Ultrahigh Vacuum," *Jpn. Jour. Appl. Phys.*, vol. 30, No. 6B, Jun. 1991, pp. L1136–L1138.

Kado et al., "Heteroepitaxial Growth of SrO Films on Si Substrates," *J. Appl. Phys.*, 61(6), Mar. 15, 1987, pp. 2398–2400.

H. Ishiwara et al., "Epitaxial Growth of Pervoskite Type Oxide Films on Substrates"; *Materials Research Symposium Proceedings*, vol. 220, pp. 595–600, Apr. 29–May 3, 1991.

J.K. Abrokwah, et al.; "A Manufacturable High–Speed Low– Power Complementary GaAs Process"; Extended Abstracts of the 1994 International Conference on Solid State Devices and Materials, Yokohama, 1994, pp. 592–594.

C.J. Palmstrom et al.; "Stable and Epitaxial Contacts to III–V Compound Semiconductors"; Contacts to Semiconductors Fundamentals and Technology; Noyles Publications, 1993: pp. 67–150.

Jayshri Sabarinathat, et al.; "Submicron three–dimensional infrared GaAs/Al$_x$O$_y$–based photonic crystal using single–step epitaxial growth"; Applied Physics Letters, vol. 78, No. 20, May 14, 2001; pp. 3024–3026.

Philip Ball; "The Next Generation of Optical Fibers"; Technology Review, May 2001; pp. 55–61.

John D. Joannopoulos, et al.; "Molding the Flow of Light"; Photonic Crystals; Princeton University Press, 1995.

Thomas F. Krauss, et al.; "Photonic crystals in the optical regime –past, present and future"; Progress in Quantum Electronics 23 (1999) 51–96.

G.H. Jin et al.; "PLZT Film Waveguide Match–Zehnder Electrooptic Modulator"; Journal of Lightwave Technology, vol. 18, No. 6. Jun. 2000; pp. 807–812.

D.E. Aspines, et al.; "Steps on (001) silicon surfaces"; J. Vac. Sci. Technol. B, vol. 5, No. 4, Jul/Aug 1987; pp. 939–944.

D.M. Newns, et al.; "Mott transition field effect transistor"; Applied Physics Letters, vol. 73, No. 6, Aug. 10, 1998; pp. 780–782.

Lucent Technologies, Inc. "Arrayed Waveguide Grating Multiplexer/ Demultiplexer"; Jan. 2000; 4 pages.

Hisashi Shichijo, et al.; "Co–Integration of GaAs Mesfet and Si CMOS Circuits"; IEEE Electron Device Letters, vol. 9, No. 9, Sep. 1988; pp. 444–446.

H. Shichijo, et al.; "GaAs Mesfet and Si CMOS Cointegration and Circuit Techniquea"; 1998 IEEE; GaAs IC Symposium–239–242.

Z.H. Zhu, et al. "Growth of InGaAs multi–quantum wells–quantum wells at 1.3 m wavelength on GaAs compliant substrates"; Applied Physics Letters, vol. 72, No. 20, May 18, 1998; pp. 2598–2600.

Kurt Eisennbeiser, et al.; "Metamorphic InAlAs/InGaAs Enhancement Mode HEMT's on GaAs Substrates"; IEEE Electron Device Letters, vol. 20, No. 10, Oct. 1999; pp, 507–509.

Tomonori Nagashima, et al.; "Three–Terminal Tandem Solar Cells with a Back Content Type Bottom Cell" Higashifuji Technical Center, Toyota Motor Corporation; 4 pages.

James Schellenberg, et al.; "Low–Loss, Planar Monolithic Baluns for K/Ka–Band Applications"; 1999 IEEE MTT–S Digest; pp. 1733–1736.

Patent Abstracts of Japan, vol. 012, No. 077, Mar. 10, 1988 & JP 62 216600, Sep. 24, 1987.

R.D. Vispute; "High quality optoelectronic grade epitaxial AIN films on –Al$_2$O$_3$, Si and 6H–SiC by pulsed laser deposition"; Thin Solid Films 299 (1997), pp. 94–103.

T. Warren Weeks, et al.; "GaN thin films deposited via organometallic vapor phase epitaxy on (6H)–SiC(0001)using high–temperature monocrystalline AIN buffer layers" Applied Physics Letters, vol. 67, No. 3, Jul. 17, 1995, pp. 1401–1403.

Z. Yu, et al.; "Epitaxial oxide thin films on SI(001)*"; J. Vac. Sci. Technol. B. vol. 18, No. 4, Jul/Aug 2000; pp. 2139–2145.

Gentax Corporate Website; Photoelectric Smoke Detectors –How They Work; 2001.

Jeffrey B. Casady, et al.; "A Hybrid 6H–SiC Temperature Sensor Operational from 25 C to 500 C"; IEEE Transactions on Components, Packaging, and Manufacturing Technology – Part A, vol. 19, No. 3, Sep. 1996; pp. 416–422.

Ronald W. Waynant, et al.; "Optoelectronic Integrated Circuits"; Electro–Optics Handbook, McGraw–Hill, Inc., 1994; Chapter Twenty Seven.

Antonio Mecozzi, et al.; "The Roles of Semiconductor Optical Amplifiers in Optical Networks"; Optics & Photonics News; Mar. 2001; pp. 37–42.

D.A. Francis, et al.; "A single–chip linear optical amplifier"; OFC, 2001; Mar. 17–22, 2001.

Patent Abstracts of Japan, vol. 015, No. 098, Mar. 8, 1991 & JP 02 306680. Dec. 20, 1990.

Peter S. Guilfoyle, et al.; "Optoelectronic Architecture for High–Speed Switching and Processing Applications "; 1998 The Photonics Design and Applications Handbook; pp. H–399–H–406.

Gerald B. Stringfellow; "Organometallic Vapor–Phase Epitaxy: Theory and Practice"; Departments of Materials Science and Engineering and Electrical Engineering, University of Utah; Academic Press, 1989.

M.A. Herman, et al.; "Molecular Beam Epitaxy Fundamentals and Current Status"; Springer–Verlag Berlin Heidelberg, 1989, 1996.

"Integration of GaAs on Si Using a Spinal Buffer Layer", IBM Technical Bulletin, vol. 30, No. 6, Nov. 1987, p. 365.

"GaInAs Superconducting FET," IBM Technical Bulletin, vol. 36, No. 8, Aug. 1993, pp. 655–656.

"Epitaxial 3d Structure Using Mixed Spinels, " IBM Technical Bulletin, vol. 30, No. 3, Aug. 1987, p. 1271.

Moon et al., "Roles of Buffer Layers in Epitaxial Growth of $SrTiO_3$ Films on Silicon Substrates, "*Japan J of Appl. Phys.*, vol. 33, Mar. 1994, pp. 1472–1477.

Yodo et al., GaAs Heteroepitaxial Growth on Si Substrates with Thin Si Interlayers in situ Annealed at High Temperatures, *8257b Journal of Vacuum Science & Technology*, 1995 May/Jun., vol. 13, No. 3, pp. 1000–1005.

Cuomo et al., "Substrate Effect on the Superconductivity of $YBa_2Cu_3O_7$ Thin Films," AIP Conference 1988, pp. 141–148.

McKee et al., "Crystalline Oxides on Silicon: The First Five Monolayers," *Physical Review Letters*, vol. 81, No. 14, Oct. 1998, pp. 3014–3017.

McKee et al., "Molecular Beam Epitaxy Barium Silicide, Barium Oxide, and Barium Titanite on Silicon," *1991 American Institute of Physics*, pp. 782–784, Aug. 13, 1991.

Tambo et al., Molecular Beam Epitaxy Growth of $SrTiO_3$ Films on Si(100)–2x1 with SrO Buffer Layer,*Jpn. J. Appl. Phys.*, vol. 37, 1998, pp. 4454–4459.

McKee et al., "The MBE Growth and Optical Quality of $BaTiO_3$ and $SrTiO_3$ Thin Films on MgO", *Mat. Res. Soc. Symp. Proc.*, vol. 341, Apr. 1994, pp. 309–314.

McKee et al., "$BaSi_2$ and Thin Film Alkaline Earth Silicides on Silicon," *Appl. Phys. Lett.*, 63 (20), Nov. 1993, pp. 2818–2820.

McKee et al., "Surface Structures and the Orthorhombic Transformation of Thin Film $BaSi_2$ on Silicon," *Mat. Res. Soc. Symp. Proc.*, vol. 221, pp. 131–136.

Brian A. Floyd, et al.; "The projected Power Consumption of a Wireless Clock Distribution System and Comparison to Conventional Distribution Systems"; IEEE, 1999; pp. IITC99–249–IITC99–250.

Mori et al., "Epitaxial Growth of $SrTiO_3$ Films on Si(100) Substrates Using a Focused Electron Beam Evaporation Method," *Jpn. J. of Apl. Phys.*, vol. 30, No. 8A, Aug. 1991, pp. L1415–L1417.

Moon et al., "Growth of Crystalline $SrTiO_3$ Films in Si Substrates Using Thin Fluoride Buffer Layers and Their Electrical Properties," *Jpn. J. of Appl. Phys.*, vol. 33, (1994), pp. 5911–5916.

Farrow et al., "Heteroepitaxy of Dissimilar Materials," *Mat. Res. Soc. Symposium Proceedings*, vol. 221, pp. 29–34, Apr. 29–May 2, 1991.

Ishiwara et al., "Heteroepitaxy on Silicon: Fundamentals, Structure, and Devices," *Mat. Res. Soc.*, Symposium Proceedings, vol. 116, pp. 369–374, Apr. 5–8, 1988.

Douglas B. Chrisey, et al; Pulsed Laser Deposition of Thin Films; pp. 273–285.

B.A. Block, et al; "Photoluminescence properties of $Er^3$–doped $BaTiO_3$ thin films"; Appl. Phys. Lett. 65 (1), Jul. 4,1994 , pp. 25–27.

Kevin J. Chen et al; "A Novel Ultrafest Functional Device: Resonant Tunneling High Electron Mobility Transistor"; Electron Devices Meetingk 1996; IEEE Hong Kong; Jun. 29, 1996; pp. 60–63, XP010210167.

Wenhua Zhu et al.; "Molecular Beam Epitaxy of GaAs on Si–on–Insulator"; 320 Applied Physics Letters 59(1991) Jul. 8, No. 2; pp. 210–212.

Umesh K. Mishra et al.; "Oxide Based Compound Semiconductor Electronics"; Electron Devices Meeting; 1997; Technical Digest, International; Washington, D.C.; Dec. 7–10, 1997; pp. 545–548.

J.M. Daughton et al.; "Applications of Spin Dependent Transport Materials"; J. Phys. D. Appl. Phys. 32(1999) R169–R177.

Wei Zhang et al.; "Stress Effect and Enhanced Magnetoresistance in $La_{0.67}Ca_{0.33}MnO_{3-\delta}$ Films"; Physical Review, B. Condensed Matter; American Institute of Physics; vol. 58, No. 21, Part 1; Dec. 1, 1998; pp. 14143–14146.

Q.–Y. Tong et al.; "IOS–a new type of materials combination for system–on–a chip preparation"; 1999 IEEE International SOI Conference, Oct. 1999; pp. 104–105.

T. Kannaianen et al.; "Growth of Dielectric 1hfo2/Ta205 Thin Film Nanolaminate Capacitors By Atomic Layer Epitaxy"; Electrochemical Society Proceedings, U.S. Electrochemical Society; Pennington, N.J.; Aug. 31, 1997; pp. 36–46.

Myung Bok Lee; "Heteroepitaxial Growth of $BaTio_3$ Films on Si by Pulsed Laser Deposition"; Applied Physics Letters; Mar. 13, 1995; pp. 1331–1333.

Myung Bok Lee; "Formation and Characterization of Eptiaxial $TiO_2$ and $BaTiO_3/TiO_2$ Films on Substrate"; Japan Journal Applied Physics Letters; vol. 34; 1995; pp. 808–811.

Gilbert Lacarpentiar et al.; "High Accuracy Machine Automated Assembly for Opto Electronics"; 2000 Electronic Components and Technology Conference; pp. 1–4.

R. Ramesh; "Ferroelectric La–Sr–Co–O/Pb–Zr–Ti–O/La–Sr–Co–O Heterostructures on Silicon via Template Growth"; 320 Applied Physics Letters; 63(1993); Dec. 27; No. 26; pp. 3592–3594.

K. Eisenbeiser, "Field Effect Transistors with $SrTiO_3$ Gate Dielectric on Si"; Applied Physics Letters; vol. 76, No. 10; Mar. 6, 2000; pp. 1324–1326.

Stephen A. Mass; "Microwave Mixers"; Second Edition; 2 pp.

Douglas J. Hamilton et al.; "Basic Integrated Circuit Engineering"; pp. 2; 1975.

Takeshi Obata; "Tunneling Magnetoresistance at Up to 270 K in $La_{0.8}Sr_{0.2}MnO_3/La_{0.8}Sr_{0.2}MnO_3$ Junctions with 1.6–nm–Thick Barriers"; Applied Physics Letters; vol. 74, No. 2; Jan. 11, 1999; pp. 290–292.

Wei Zhang et al.; "Enhanced Magnetoresistance in La–Ca–Mn–O Films on Si Substrates Using $YbaCuO/CeO_2$ Heterostructures"; Physica C; vol. 282–287, No. 2003; Aug. 1, 1997; pp. 1231–1232.

Shogo Imada et al.; "Epitaxial Growth of Ferroelectric $YmnO_3$ Thin Films on Si (111) Substrates by Molecular Beam Epitaxy"; Jpn. J. Appl. Phys. vol. 37 (1998); pp. 6497–6501; Part 1, No. 12A, Dec. 1998.

Ladislav Pust et al.; "Temperature Dependence of the Magnetization Reversal in Co(fcc)–BN–Co(poly hcp) Structures"; Journal of Applied Physics; vol. 85, No. 8; Apr. 1999; 5765–5767.

C. Martinez; "Epitaxial Metallic Nanostructures on GaAs"; Surface Science; vol. 482–485; pp. 910–915; 2001.

Wen–Ching Shih et al.; "Theoretical Investigation of the SAW Properties of Ferroelectric Film Composite Structures"; IEEE Transactions of Ultrasonics, Ferroelectrics, and Frequency Control; vol. 45, No. 2; Mar. 1998; pp. 305–316.

Zhu Dazhong et al.; "Design of $ZnO/SiO_2/Si$ Monolithic Integrated Programmable SAW Filter"; Proceedings of Fifth International Conference on Solid–State and Integrated Circuit Technology; 21–23; Oct. 1998; pp. 826–829.

Kirk–Othmer Encyclopedia of Chemical Technology; Fourth Edition, vol. 12; Fueld Resources to Heat Stabilizers; A Wiley–Interscience Publication; John Wiley & Sons.

John W. Goodman et al; "Optical Interconnections For VLSI Systems"; Proceedings of the IEEE, vol. 72, No. 7 Jul. 1984.

Fathimulla et al.; "Monolithic Integration of InGaAs/InAlAs MODFETs and RTDs on InP–bonded–to Si Substrate"; Fourth International Conference on Indium Phosphide and Related Materials, Newport, RI, USA; Apr. 21–24, 1992; pp. 167–170; XP000341253; IEEE, New York, NY, USA; ISBN: 0–7803–0522–1.

H. Takahashi et al.; "Arrayed–Waveguide Grating for Wavelength Division Multi–Demultiplexer with Nanometre REsolution"; Electronics Letters; vol. 26., No. 2, Jan 18, 1990.

Pierret, R.F.; "1/J–FET and MESFET"; Field Effect Devices; MA, Addison–Wesley; 1990; pp. 9–22.

M. Schreiter, et al.; "Sputtering of Self–Polarized PZT Films for IR–Detector Arrays"; 1998 IEEE; pp. 181–185.

Hideaki Adachi et al.; "Sputtering Preparation of Ferroelectric PLZT Thin Films and Their Optical Applications"; IEEE Transactions of Ultrasonics, Ferroelectrics and Frequency Control, vol. 38, No. 6, Nov. 1991.

A.J. Moulson et al.; "Electroceramics Materials Properties Applications"; Chapman & Hall; pp. 366–369.

P.A. Langjahr et al.; "Epitaxial Growth and Structure of Cubic and Pseudocubic Pervoskite Films on Perovskite Substrates"; Mat. Res. Soc. Symp/ Proc., vol. 401; 1995 Materials Research Society; pp. 109–114.

Wang et al.; "Depletion–Mode GaAs MOSFETs with Negligible Drain Current Drift and Hysteresis"; Electron Devices Meeting, 1998, IEDM '98 Technical Digest; pp. 67–70.

Ben G. Streetman; "Solid State Electronic Devices"; 1990, Prentice Hall; Third Edition; pp. 320–322.

A.Y. Wu et al.; "Highly Oriented $(Pb, La)(Zr, Ti)O_3$ Thin Films on Amorphous Substrates"; IEEE, 1992; pp. 301–304.

Timothy E. Glassman et al.; "Evidence for Cooperative Oxidation of MoCVD Precursors Used in $Ba_xSr_{1-x}TiO_3$ Film Growth"; Mat. Res. Soc. Symp. Proc. vol. 446, 1997 Materials Research Society; pp. 321–326.

S.N. Subbarao et al.; "Monolithic PIN Photodetector and FET Amplifier on GaAs–os–Si"; IEEE; GaAs IC Symposium–163–166; 1989.

T.A. Langdo et al.; "High Quality Ge on Si by Epitaxial Necking"; Applied Physics Letters; vol. 76, No. 25; pp. 3700–3702; Jun. 19, 2000.

Chenning Hu et al.; Solar Cells From Basics To Advanced Systems; McGraw–Hill Book Company; 1983.

O.J. Painter et al; "Room Temperature Photonic Crystal Defect Lasers at Near–Infrared Wavelengths in InGaAsp"; Journal of Lightwave Technology, vol. 17, No. 11; Nov. 1999.

C. Donn et al.; "A 16–Element, K–Band Monolithic Active Receive Phased Array Antenna"; Antennas and Propagation Society International Symposium, 1988; pp. 188–191, vol. 1; Jun. 6–10, 1988.

Don W. Shaw; "Epitaxial GaAs on Si: Progress and Potential Applications"; Mat. Res. Soc. Symp. Proc.; pp. 15–30; 1987.

G.J.M. Dormans, et al.; "$PbTiO_{/3}$/Thin Films Grown by Organometallic Chemical Vapour Deposition"; Third International Symposium on Integrated Ferroelectrics; Apr. 3–5, 1991 (Abstract).

P.J. Borrelli et al.; "Compositional and Structural Properties of Sputtered PLZT Thin Films"; Ferroelectric Thin Films II Symposium; Dec. 2–4, 1991 (Abstract).

Ranu Nayak et al; "Enhanced acousto–optic diffraction efficiency in a symmetric SrRiO3/BaTiO3 thin–film heterostructure"; Nov. 1, 2000; vol. 39, No. 31; Applied Optics; pp. 5847–5853.

Ranu Nayak et al; "Studies on acousti–optical interaction in SrTiO3/BaTiO3/SrTiO3 epitaxial thin film heterostructures"; J. Phys. D: Appl. Phys. 32 (1999) 380–387.

S.K. Tewksbury et al.; "Cointegration of Optoelectronics and Submicron CMOS"; Wafer Scale Integration; 1993; Proceedings, Fifth Annual IEEE; Jan. 20, 1993; pp. 358–367.

V. Kaushik et al.; "Device Characteristics of Crystalline Epitaxial Oxides on Silicon"; Device Research Conference, 2000; Conference Digest 58th DRC; pp. 17–20l Jun. 19–21, 2000.

Katherine Derbyshire; "Prospects Bright for Optoelectronics vol., Cost Drive Manufacturing for Optical Applications"; Semiconductor Magazine; vol. 3, No. 3; Mar. 2002.

Alex Chediak et al.; "Integration of GaAs/Si with Buffer Layers and Its Impact on Device Integration"; TICS 4, Prof. Sands. MSE 225, Apr. 12, 2002; pp. 1–5.

S.A. Chambers et al; "Band Discontinuities at Epitaxial SrTiO3/Si(001) Heterojunctions"; Applied Physics Letters; vol. 77, No. 11; Sep. 11, 2000; pp. 1662–1664.

H. Shichijo, et al.; "Monolithic Process for Co–Integration of GaAs and Silicon Circuits"; 1988 IEEE; pp. 778–781.

* cited by examiner

METHOD AND APPARATUS FOR CONTROLLING ANTI-PHASE DOMAINS IN SEMICONDUCTOR STRUCTURES AND DEVICES

FIELD OF THE INVENTION

This invention relates generally to semiconductor structures and devices and to a method for their fabrication, and more specifically to a method and apparatus for controlling anti-phase domains in semiconductor structures, devices, and integrated circuits that include a monocrystalline material layer comprised of semiconductor material, compound semiconductor material, and/or other types of material such as metals and non-metals.

BACKGROUND OF THE INVENTION

Semiconductor devices often include multiple layers of conductive, insulating, and semiconductive layers. Often, the desirable properties of such layers improve with the crystallinity of the layer. For example, the electron mobility and band gap of semiconductive layers improves as the crystallinity of the layer increases. Similarly, the free electron concentration of conductive layers and the electron charge displacement and electron energy recoverability of insulative or dielectric films improves as the crystallinity of these layers increases.

For many years, attempts have been made to grow various monolithic thin films on a foreign substrate such as silicon (Si). To achieve optimal characteristics of the various monolithic layers, however, a monocrystalline film of high crystalline quality is desired. Attempts have been made, for example, to grow various monocrystalline layers on a substrate such as germanium, silicon, and various insulators. These attempts have generally been unsuccessful because lattice mismatches between the host crystal and the grown crystal have caused the resulting layer of monocrystalline material to be of low crystalline quality. An additional reason these attempts have been unsuccessful is that the various layers contain steps which may lead to the formation of anti-phase domains and degrade the performance of the semiconductor structure.

If a large area thin film of high quality monocrystalline material lacking some of the deleterious effects associated with anti-phase domains was available at low cost, a variety of semiconductor devices could advantageously be fabricated in or using that film at a low cost compared to the cost of fabricating such devices beginning with a bulk wafer of semiconductor material or in an epitaxial film of such material on a bulk wafer of semiconductor material. In addition, if a thin film of high quality monocrystalline material lacking some of the deleterious effects associated with the presence of anti-phase domains could be realized beginning with a bulk wafer such as a silicon wafer, an integrated device structure could be achieved that took advantage of the best properties of both the silicon and the high quality monocrystalline material.

Accordingly, a need exists for a semiconductor structure that provides a high quality monocrystalline film or layer over another monocrystalline material and for a process for making such a structure. In other words, there is a need for providing the formation of a monocrystalline substrate that is compliant with a high quality monocrystalline material layer so that true two-dimensional growth can be achieved for the formation of quality semiconductor structures, devices and integrated circuits having grown monocrystalline film having the same crystal orientation as an underlying substrate. This monocrystalline material layer may be comprised of a semiconductor material, a compound semiconductor material, and other types of material such as metals and non-metals.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
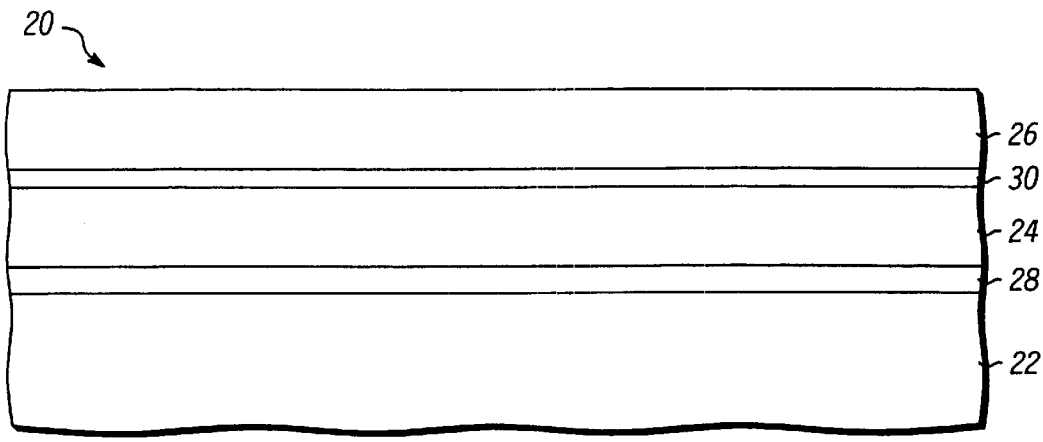
FIGS. 1, 2, and 3 illustrate schematically, in cross section, device structures in accordance with various embodiments of the invention.

FIG. 1 illustrates schematically, in cross section, a portion of a semiconductor structure 20 in accordance with an embodiment of the invention. Semiconductor structure 20 includes a monocrystalline substrate 22, accommodating buffer layer 24 comprising a monocrystalline material, and a monocrystalline material layer 26. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

In accordance with one embodiment of the invention, structure 20 also includes an amorphous intermediate layer 28 positioned between substrate 22 and accommodating buffer layer 24. Structure 20 may also include a template layer 30 between the accommodating buffer layer and monocrystalline material layer 26. As will be explained more fully below, the template layer helps to initiate the growth of the monocrystalline material layer on the accommodating buffer layer. The amorphous intermediate layer helps to relieve the strain in the accommodating buffer layer and by doing so, aids in the growth of a high crystalline quality accommodating buffer layer.

Substrate 22, in accordance with an embodiment of the invention, is a monocrystalline semiconductor or compound semiconductor wafer, preferably of large diameter. The wafer can be of, for example, a material from Group IV of the periodic table. Examples of Group IV semiconductor materials include silicon, germanium, mixed silicon and germanium, mixed silicon and carbon, mixed silicon, germanium and carbon, and the like. Preferably substrate 22 is a wafer containing silicon or germanium, and most preferably is a high quality monocrystalline silicon wafer as used in the semiconductor industry. Accommodating buffer layer 24 is preferably a monocrystalline oxide or nitride material epitaxially grown on the underlying substrate. In accordance with one embodiment of the invention, amorphous intermediate layer 28 is grown on substrate 22 at the interface between substrate 22 and the growing accommodating buffer layer by the oxidation of substrate 22 during the growth of layer 24. The amorphous intermediate layer serves to relieve strain that might otherwise occur in the monocrystalline accommodating buffer layer as a result of differences in the lattice constants of the substrate and the buffer layer. As used herein, lattice constant refers to the distance between atoms of a cell measured in the plane of the surface. If such strain is not relieved by the amorphous intermediate layer, the strain may cause defects in the crystalline structure of the accommodating buffer layer. Defects in the crystalline structure of the accommodating buffer layer, in turn, would make it difficult to achieve a high quality crystalline structure in monocrystalline material layer 26 which may comprise a semiconductor material, a compound semiconductor material, or another type of material such as a metal or a non-metal.

Accommodating buffer layer 24 is preferably a monocrystalline oxide or nitride material selected for its crystalline compatibility with the underlying substrate and with the overlying material layer. For example, the material could be an oxide or nitride having a lattice structure closely matched to the substrate and to the subsequently applied monocrystalline material layer. Materials that are suitable for the accommodating buffer layer include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, and gadolinium oxide. Additionally, various nitrides such as gallium nitride, aluminum nitride, and boron nitride may also be used for the accommodating buffer layer. Most of these materials are insulators, although strontium ruthenate, for example, is a conductor. Generally, these materials are metal oxides or metal nitrides, and more particularly, these metal oxide or nitrides typically include at least two different metallic elements. In some specific applications, the metal oxides or nitrides may include three or more different metallic elements.

Amorphous interface layer 28 is preferably an oxide formed by the oxidation of the surface of substrate 22, and more preferably is composed of a silicon oxide. The thickness of layer 28 is sufficient to relieve strain attributed to mismatches between the lattice constants of substrate 22 and accommodating buffer layer 24. Typically, layer 28 has a thickness in the range of approximately 0.5–5 nm.

The material for monocrystalline material layer 26 can be selected, as desired, for a particular structure or application. For example, the monocrystalline material of layer 26 may comprise a compound semiconductor which can be selected, as needed for a particular semiconductor structure, from any of the Group IIIA and VA elements (III–V semiconductor compounds), mixed III–V compounds, Group II(A or B) and VIA elements (II–VI semiconductor compounds), and mixed II–VI compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), and the like. However, monocrystalline material layer 26 may also comprise other semiconductor materials, metals, or non-metal materials which are used in the formation of semiconductor structures, devices and/or integrated circuits.

Appropriate materials for template 30 are discussed below. Suitable template materials chemically bond to the surface of the accommodating buffer layer 24 at selected sites and provide sites for the nucleation of the epitaxial growth of monocrystalline material layer 26. When used, template layer 30 has a thickness ranging from about 1 to about 10 monolayers.

Figure 2:
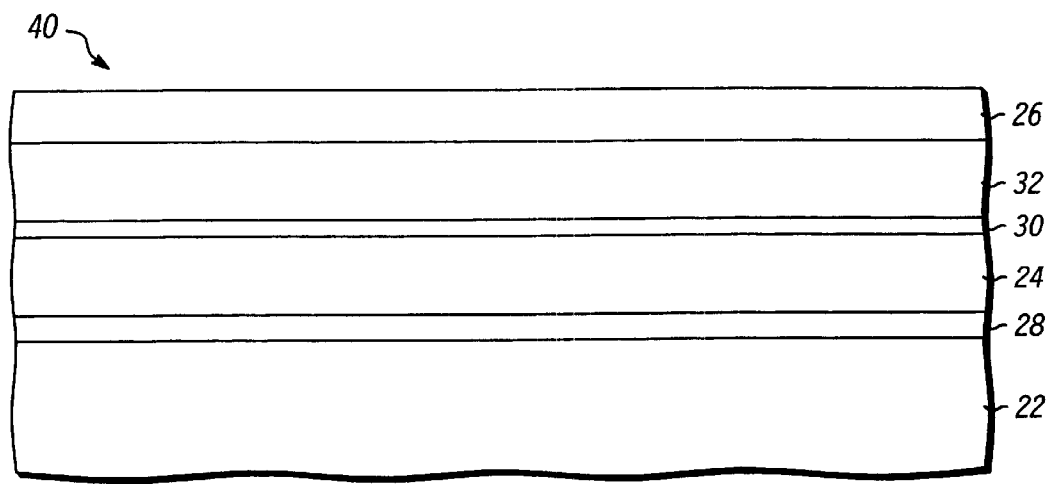

FIG. 2 illustrates, in cross section, a portion of a semiconductor structure 40 in accordance with a further embodiment of the invention. Structure 40 is similar to the previously described semiconductor structure 20, except that an additional buffer layer 32 is positioned between accommodating buffer layer 24 and monocrystalline material layer 26. Specifically, the additional buffer layer is positioned between template layer 30 and the overlying layer of monocrystalline material. The additional buffer layer, formed of a semiconductor or compound semiconductor material when the monocrystalline material layer 26 comprises a semiconductor or compound semiconductor material, serves to provide a lattice compensation when the lattice constant of the accommodating buffer layer cannot be adequately matched to the overlying monocrystalline semiconductor or compound semiconductor material layer.

Figure 3:
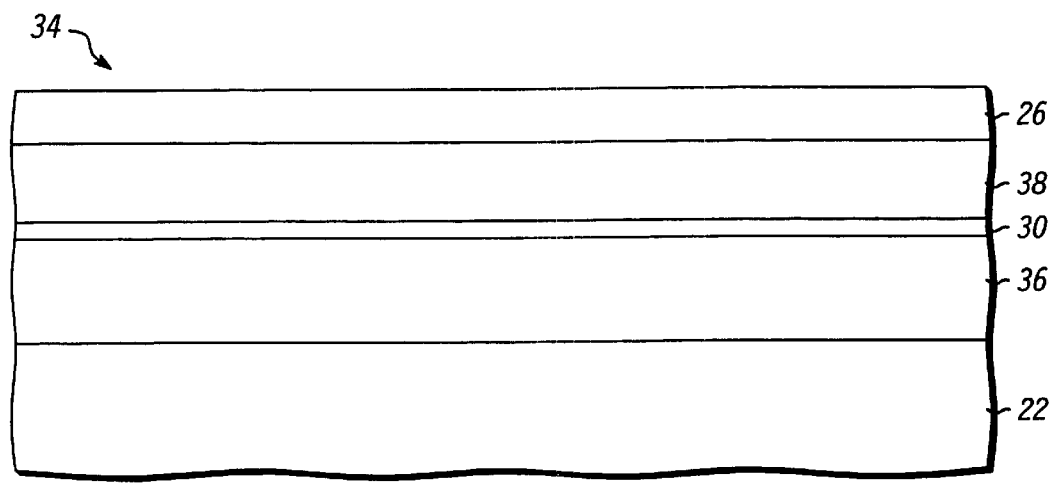

FIG. 3 schematically illustrates, in cross section, a portion of a semiconductor structure 34 in accordance with another exemplary embodiment of the invention. Structure 34 is similar to structure 20, except that structure 34 includes an amorphous layer 36, rather than accommodating buffer layer 24 and amorphous interface layer 28, and an additional monocrystalline layer 38.

As explained in greater detail below, amorphous layer 36 may be formed by first forming an accommodating buffer layer and an amorphous interface layer in a similar manner to that described above. Monocrystalline layer 38 is then formed (by epitaxial growth) overlying the monocrystalline accommodating buffer layer. The accommodating buffer layer is then exposed to an anneal process to convert the monocrystalline accommodating buffer layer to an amorphous layer. Amorphous layer 36 formed in this manner comprises materials from both the accommodating buffer and interface layers, which amorphous layers may or may not amalgamate. Thus, layer 36 may comprise one or two amorphous layers. Formation of amorphous layer 36 between substrate 22 and additional monocrystalline layer 26 (subsequent to layer 38 formation) relieves stresses between layers 22 and 38 and provides a true compliant substrate for subsequent processing—e.g., monocrystalline material layer 26 formation.

The processes previously described above in connection with FIGS. 1 and 2 are adequate for growing monocrystalline material layers over a monocrystalline substrate. However, the process described in connection with FIG. 3, which includes transforming a monocrystalline accommodating buffer layer to an amorphous oxide layer, may be better for growing monocrystalline material layers because it allows any strain in layer 26 to relax.

Additional monocrystalline layer 38 may include any of the materials described throughout this application in connection with either of monocrystalline material layer 26 or additional buffer layer 32. For example, when monocrystalline material layer 26 comprises a semiconductor or compound semiconductor material, layer 38 may include monocrystalline Group IV or monocrystalline compound semiconductor materials.

In accordance with one embodiment of the present invention, additional monocrystalline layer 38 serves as an anneal cap during layer 36 formation and as a template for subsequent monocrystalline layer 26 formation. Accordingly, layer 38 is preferably thick enough to provide a suitable template for layer 26 growth (at least one monolayer) and thin enough to allow layer 38 to form as a substantially defect free monocrystalline material.

In accordance with another embodiment of the invention, additional monocrystalline layer 38 comprises monocrystalline material (e.g., a material discussed above in connection with monocrystalline layer 26) that is thick enough to form devices within layer 38. In this case, a semiconductor structure in accordance with the present invention does not include monocrystalline material layer 26. In other words, the semiconductor structure in accordance with this embodiment only includes one monocrystalline layer disposed above amorphous oxide layer 36.

The following non-limiting, illustrative examples illustrate various combinations of materials useful in structures 20, 40, and 34 in accordance with various alternative embodiments of the invention. These examples are merely illustrative, and it is not intended that the invention be limited to these illustrative examples.

EXAMPLE 1

In accordance with one embodiment of the invention, monocrystalline substrate 22 is a silicon substrate oriented in the (100) direction. The silicon substrate can be, for example, a silicon substrate as is commonly used in making complementary metal oxide semiconductor (CMOS) integrated circuits having a diameter of about 200–300 mm. In accordance with this embodiment of the invention, accommodating buffer layer 24 is a monocrystalline layer of $Sr_zBa_{1-z}TiO_3$ where z ranges from 0 to 1 and the amorphous intermediate layer is a layer of silicon oxide ($SiO_x$) formed at the interface between the silicon substrate and the accommodating buffer layer. The value of z is selected to obtain one or more lattice constants closely matched to corresponding lattice constants of the subsequently formed layer 26. The accommodating buffer layer can have a thickness of about 2 to about 100 nanometers (mn) and preferably has a thickness of about 5 nm. In general, it is desired to have an accommodating buffer layer thick enough to isolate the monocrystalline material layer 26 from the substrate to obtain the desired electrical and optical properties. Layers thicker than 100 nm usually provide little additional benefit while increasing cost unnecessarily; however, thicker layers may be fabricated if needed. The amorphous intermediate layer of silicon oxide can have a thickness of about 0.5–5 mn, and preferably a thickness of about 1 to 2 mn.

In accordance with this embodiment of the invention, monocrystalline material layer 26 is a compound semiconductor layer of gallium arsenide (GaAs) or aluminum gallium arsenide (AlGaAs) having a thickness of about 1 mn to about 100 micrometers ($\mu$m) and preferably a thickness of about 0.5 $\mu$m to 10 $\mu$m. The thickness generally depends on the application for which the layer is being prepared. To facilitate the epitaxial growth of the gallium arsenide or aluminum gallium arsenide on the monocrystalline oxide, a template layer is formed by capping the oxide layer. The template layer is preferably 1–10 monolayers of Ti—As, Sr—O—As, Sr—Ga—O, or Sr—Al—O. By way of a preferred example, 1–2 monolayers of Ti—As or Sr—Ga—O have been illustrated to successfully grow GaAs layers.

EXAMPLE 2

In accordance with a further embodiment of the invention, monocrystalline substrate 22 is a silicon substrate as described above. The accommodating buffer layer is a monocrystalline oxide of strontium or barium zirconate or hafnate in a cubic or orthorhombic phase with an amorphous intermediate layer of silicon oxide formed at the interface between the silicon substrate and the accommodating buffer layer. The accommodating buffer layer can have a thickness of about 2–100 nm and preferably has a thickness of at least 5 nm to ensure adequate crystalline and surface quality and is formed of a monocrystalline $SrZrO_3$, $BaZrO_3$, $SrHfO_3$, $BaSnO_3$ or $BaHfO_3$. For example, a monocrystalline oxide layer of $BaZrO_3$ can grow at a temperature of about 700 degrees C. The lattice structure of the resulting crystalline oxide exhibits a 45 degree rotation with respect to the substrate silicon lattice structure.

An accommodating buffer layer formed of these zirconate or hafnate materials is suitable for the growth of a monocrystalline material layer which comprises compound semiconductor materials in the indium phosphide (InP) system. In this system, the compound semiconductor material can be, for example, indium phosphide (InP), indium gallium arsenide (InGaAs), aluminum indium arsenide, (AlInAs), or aluminum gallium indium arsenic phosphide (AlGaInAsP), having a thickness of about 1.0 nm to 10 $\mu$m. A suitable template for this structure is 1–10 monolayers of zirconium-arsenic (Zr—As), zirconium-phosphorus (Zr—P), hafnium-arsenic (Hf—As), hafnium-phosphorus (Hf—P), strontium-oxygen-arsenic (Sr—O—As), strontium-oxygen-phosphorus (Sr—O—P), barium-oxygen-arsenic (Ba—O—As), indium-strontium-oxygen (In—Sr—O), or barium-oxygen-phosphorus (Ba—O—P), and preferably 1–2 monolayers of one of these materials. By way of an example, for a barium zirconate accommodating buffer layer, the surface is terminated with 1–2 monolayers of zirconium followed by deposition of 1–2 monolayers of arsenic to form a Zr—As template. A monocrystalline layer of the compound semiconductor material from the indium phosphide system is then grown on the template layer. The resulting lattice structure of the compound semiconductor material exhibits a 45 degree rotation with respect to the accommodating buffer layer lattice structure and a lattice mismatch to (100) InP of less than 2.5%, and preferably less than about 1.0%.

EXAMPLE 3

In accordance with a further embodiment of the invention, a structure is provided that is suitable for the growth of an epitaxial film of a monocrystalline material comprising a II–VI material overlying a silicon substrate. The substrate is preferably a silicon wafer as described above. A suitable accommodating buffer layer material is $Sr_xBa_{1-x}TiO_3$, where x ranges from 0 to 1, having a thickness of about 2–100 nm and preferably a thickness of about 5–15 nm. Where the monocrystalline layer comprises a compound semiconductor material, the II–VI compound semiconductor material can be, for example, zinc selenide (ZnSe) or zinc sulfur selenide (ZnSSe). A suitable template for this material system includes 1–10 monolayers of zinc-oxygen (Zn—O) followed by 1–2 monolayers of an excess of zinc followed by the selenidation of zinc on the surface. Alternatively, a template can be, for example, 1–10 monolayers of strontium-sulfur (Sr—S) followed by the ZnSeS.

EXAMPLE 4

This embodiment of the invention is an example of structure 40 illustrated in FIG. 2. Substrate 22, accommodating buffer layer 24, and monocrystalline material layer 26 can be similar to those described in example 1. In addition, an additional buffer layer 32 serves to alleviate any strains that might result from a mismatch of the crystal lattice of the accommodating buffer layer and the lattice of the monocrystalline material. Additional buffer layer 32 can be a layer of germanium or a GaAs, an aluminum gallium arsenide (AlGaAs), an indium gallium phosphide (InGaP), an aluminum gallium phosphide (AlGaP), an indium gallium arsenide (InGaAs), an aluminum indium phosphide (AlInP), a gallium arsenide phosphide (GaAsP), or an indium gallium phosphide (InGaP) strain compensated superlattice. In accordance with one aspect of this embodiment, additional buffer layer 32 includes a $GaAs_xP_{1-x}$ superlattice, wherein the value of x ranges from 0 to 1. In accordance with another aspect, additional buffer layer 32 includes an $In_yGa_{1-y}P$ superlattice, wherein the value of y ranges from 0 to 1. By varying the value of x or y, as the case may be, the lattice constant is varied from bottom to top across the superlattice to create a match between lattice constants of the underlying oxide and the overlying monocrystalline material which in this example is a compound semiconductor material. The compositions of other compound semiconductor materials, such as those listed above, may also be similarly varied to manipulate the lattice constant of the additional buffer layer 32 in a like manner. The superlattice can have a thickness of about 50–500 nm and preferably has a thickness of about 100–200 nm. The template for this structure can be the same of that described in example 1. Alternatively, additional buffer layer 32 can be a layer of monocrystalline germanium having a thickness of 1–50 nm and preferably having a thickness of about 2–20 nm. In using a germanium buffer layer, a template layer of either germanium-strontium (Ge—Sr) or germanium-titanium (Ge—Ti) having a thickness of about one monolayer can be used as a nucleating site for the subsequent growth of the monocrystalline material layer which in this example is a compound semiconductor material. The formation of the oxide layer is capped with either a monolayer of strontium or a monolayer of titanium to act as a nucleating site for the subsequent deposition of the monocrystalline germanium. The monolayer of strontium or titanium provides a nucleating site to which the first monolayer of germanium can bond.

EXAMPLE 5

This example also illustrates materials useful in a structure 40 as illustrated in FIG. 2. Substrate material 22, accommodating buffer layer 24, monocrystalline material layer 26 and template layer can be the same as those described above in example 2. In addition, additional buffer layer 32 is inserted between the accommodating buffer layer and the overlying monocrystalline material layer. The buffer layer, a further monocrystalline material which in this instance comprises a semiconductor material, can be, for example, a graded layer of indium gallium arsenide (InGaAs) or indium aluminum arsenide (InAlAs). In accordance with one aspect of this embodiment, additional buffer layer 32 includes InGaAs, in which the indium composition varies from 0 to about 50%. The additional buffer layer 32 preferably has a thickness of about 10–30 nm. Varying the composition of the buffer layer from GaAs to InGaAs serves to provide a lattice match between the underlying monocrystalline oxide material and the overlying layer of monocrystalline material which in this example is a compound semiconductor material. Such a buffer layer is especially advantageous if there is a lattice mismatch between accommodating buffer layer 24 and monocrystalline material layer 26.

EXAMPLE 6

This example provides exemplary materials useful in structure 34, as illustrated in FIG. 3. Substrate material 22, template layer 30, and monocrystalline material layer 26 may be the same as those described above in connection with example 1.

Amorphous layer 36 is an amorphous oxide layer which is suitably formed of a combination of amorphous intermediate layer materials (e.g., layer 28 materials as described above) and accommodating buffer layer materials (e.g., layer 24 materials as described above). For example, amorphous layer 36 may include a combination of $SiO_x$ and $Sr_zBa_{1-z}TiO_3$ (where z ranges from 0 to 1 ),which combine or mix, at least partially, during an anneal process to form amorphous oxide layer 36.

The thickness of amorphous layer 36 may vary from application to application and may depend on such factors as desired insulating properties of layer 36, type of monocrystalline material comprising layer 26, and the like. In accordance with one exemplary aspect of the present embodiment, layer 36 thickness is about 2 nm to about 100 nm, preferably about 2–10 nm, and more preferably about 5–6 mn.

Layer 38 comprises a monocrystalline material that can be grown epitaxially over a monocrystalline oxide material such as material used to form accommodating buffer layer 24. In accordance with one embodiment of the invention, layer 38 includes the same materials as those comprising layer 26. For example, if layer 26 includes GaAs, layer 38 also includes GaAs. However, in accordance with other embodiments of the present invention, layer 38 may include materials different from those used to form layer 26. In accordance with one exemplary embodiment of the invention, layer 38 is about 1 monolayer to about 100 nm thick.

Referring again to FIGS. 1–3, substrate 22 is a monocrystalline substrate such as a monocrystalline silicon or gallium arsenide substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of the accommodating buffer layer and the monocrystalline substrate must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

Figure 4:
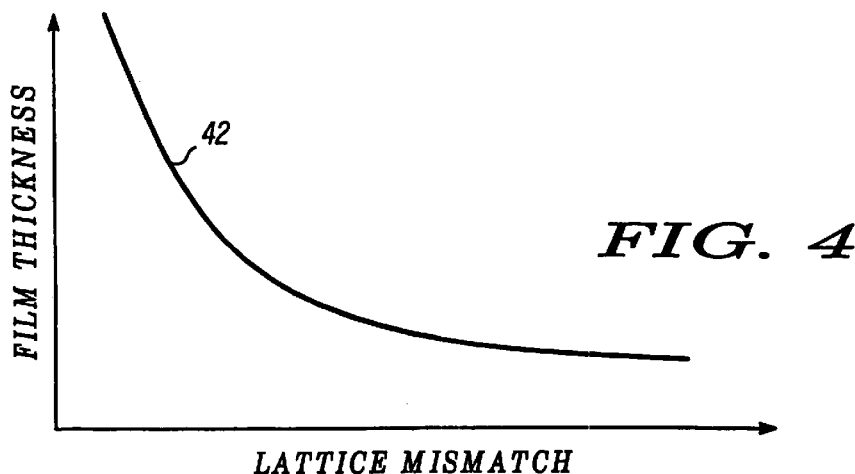
FIG. 4 illustrates graphically the relationship between maximum attainable film thickness and lattice mismatch between a host crystal and a grown crystalline overlayer.

FIG. 4 illustrates graphically the relationship of the achievable thickness of a grown crystal layer of high crystalline quality as a function of the mismatch between the lattice constants of the host crystal and the grown crystal. Curve 42 illustrates the boundary of high crystalline quality material. The area to the right of curve 42 represents layers that have a large number of defects. With no lattice mismatch, it is theoretically possible to grow an infinitely thick, high quality epitaxial layer on the host crystal. As the mismatch in lattice constants increases, the thickness of achievable, high quality crystalline layer decreases rapidly. As a reference point, for example, if the lattice constants between the host crystal and the grown layer are mismatched by more than about 2%, monocrystalline epitaxial layers in excess of about 20 mn cannot be achieved.

In accordance with one embodiment of the invention, substrate 22 is a (100) or (111) oriented monocrystalline silicon wafer and accommodating buffer layer 24 is a layer of strontium barium titanate. Substantial matching of lattice constants between these two materials is achieved by rotating the crystal orientation of the titanate material by 45° with respect to the crystal orientation of the silicon substrate wafer. The inclusion in the structure of amorphous interface layer 28, a silicon oxide layer in this example, if it is of sufficient thickness, serves to reduce strain in the titanate monocrystalline layer that might result from any mismatch in the lattice constants of the host silicon wafer and the grown titanate layer. As a result, in accordance with an embodiment of the invention, a high quality, thick, monocrystalline titanate layer is achievable.

Still referring to FIGS. 1–3, layer 26 is a layer of epitaxially grown monocrystalline material and that crystalline material is also characterized by a crystal lattice constant and a crystal orientation. In accordance with one embodiment of the invention, the lattice constant of layer 26 differs from the lattice constant of substrate 22. To achieve high crystalline quality in this epitaxially grown monocrystalline layer, the accommodating buffer layer must be of high crystalline quality. In addition, in order to achieve high crystalline quality in layer 26, substantial matching between the crystal lattice constant of the host crystal, in this case, the monocrystalline accommodating buffer layer, and the grown crystal is desired. With properly selected materials this substantial matching of lattice constants is achieved as a result of rotation of the crystal orientation of the grown crystal with respect to the orientation of the host crystal. For example, if the grown crystal is gallium arsenide, aluminum gallium arsenide, zinc selenide, or zinc sulfur selenide and the accommodating buffer layer is monocrystalline $Sr_xBa_{1-x}TiO_3$, substantial matching of crystal lattice constants of the two materials is achieved, wherein the crystal orientation of the grown layer is rotated by 45° with respect to the orientation of the host monocrystalline oxide. Similarly, if the host material is a strontium or barium zirconate or a strontium or barium hafnate or barium tin oxide and the compound semiconductor layer is indium phosphide or gallium indium arsenide or aluminum indium arsenide, substantial matching of crystal lattice constants can be achieved by rotating the orientation of the grown crystal layer by 45° with respect to the host oxide crystal. In some instances, a crystalline semiconductor buffer layer between the host oxide and the grown monocrystalline material layer can be used to reduce strain in the grown monocrystalline material layer that might result from small differences in lattice constants. Better crystalline quality in the grown monocrystalline material layer can thereby be achieved.

The following example illustrates a process, in accordance with one embodiment of the invention, for fabricating a semiconductor structure such as the structures depicted in FIGS. 1–3. The process starts by providing a monocrystalline semiconductor substrate comprising silicon or germanium. In accordance with a preferred embodiment of the invention, the semiconductor substrate is a silicon wafer having a (100) orientation. The substrate is preferably oriented on axis or, at most, about 4° off axis. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. In order to epitaxially grow a monocrystalline oxide layer overlying the monocrystalline substrate, the native oxide layer must first be removed to expose the crystalline structure of the underlying substrate. The following process is preferably carried out by molecular beam epitaxy (MBE), although other epitaxial processes may also be used in accordance with the present invention. The native oxide can be removed by first thermally depositing a thin layer of strontium, barium, a combination of strontium and barium, or other alkaline earth metals or combinations of alkaline earth metals in an MBE apparatus. In the case where strontium is used, the substrate is then heated to a temperature of about 750° C to cause the strontium to react with the native silicon oxide layer. The strontium serves to reduce the silicon oxide to leave a silicon oxide-free surface. The resultant surface, which exhibits an ordered 2×1 structure, includes strontium, oxygen, and silicon. The ordered 2×1 structure forms a template for the ordered growth of an overlying layer of a monocrystalline oxide. The template provides the necessary chemical and physical properties to nucleate the crystalline growth of an overlying layer.

In accordance with an alternate embodiment of the invention, the native silicon oxide can be converted and the substrate surface can be prepared for the growth of a monocrystalline oxide layer by depositing an alkaline earth metal oxide, such as strontium oxide, strontium barium oxide, or barium oxide, onto the substrate surface by MBE at a low temperature and by subsequently heating the structure to a temperature of about 750° C. At this temperature a solid state reaction takes place between the strontium oxide and the native silicon oxide causing the reduction of the native silicon oxide and leaving an ordered 2×1 structure with strontium, oxygen, and silicon remaining on the substrate surface. Again, this forms a template for the subsequent growth of an ordered monocrystalline oxide layer.

Following the removal of the silicon oxide from the surface of the substrate, in accordance with one embodiment of the invention, the substrate is cooled to a temperature in the range of about 200–800° C. and a layer of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stoichiometric strontium titanate at a growth rate of about 0.3–0.5 nm per minute. After initiating growth of the strontium titanate, the partial pressure of oxygen is increased above the initial minimum value. The overpressure of oxygen causes the growth of an amorphous silicon oxide layer at the interface between the underlying substrate and the growing strontium titanate layer. The growth of the silicon oxide layer results from the diffusion of oxygen through the growing strontium titanate layer to the interface where the oxygen reacts with silicon at the surface of the underlying substrate. The strontium titanate grows as an ordered (100) monocrystal with the (100) crystalline orientation rotated by 45° with respect to the underlying substrate. Strain that otherwise might exist in the strontium titanate layer because of the small mismatch in lattice constant between the silicon substrate and the growing crystal is relieved in the amorphous silicon oxide intermediate layer.

After the strontium titanate layer has been grown to the desired thickness, the monocrystalline strontium titanate is capped by a template layer that is conducive to the subsequent growth of an epitaxial layer of a desired monocrystalline material. For example, for the subsequent growth of a monocrystalline compound semiconductor material layer of gallium arsenide, the MBE growth of the strontium titanate monocrystalline layer can be capped by terminating the growth with 1–2 monolayers of titanium, 1–2 monolayers of titanium-oxygen or with 1–2 monolayers of strontium-oxygen. Following the formation of this capping layer, arsenic is deposited to form a Ti—As bond, a Ti—O—As bond or a Sr—O—As. Any of these form an appropriate template for deposition and formation of a gallium arsenide monocrystalline layer. Following the formation of the template, gallium is subsequently introduced to the reaction with the arsenic and gallium arsenide forms. Alternatively, gallium can be deposited on the capping layer to form a Sr—O—Ga bond, and arsenic is subsequently introduced with the gallium to form the GaAs.

Figure 5:
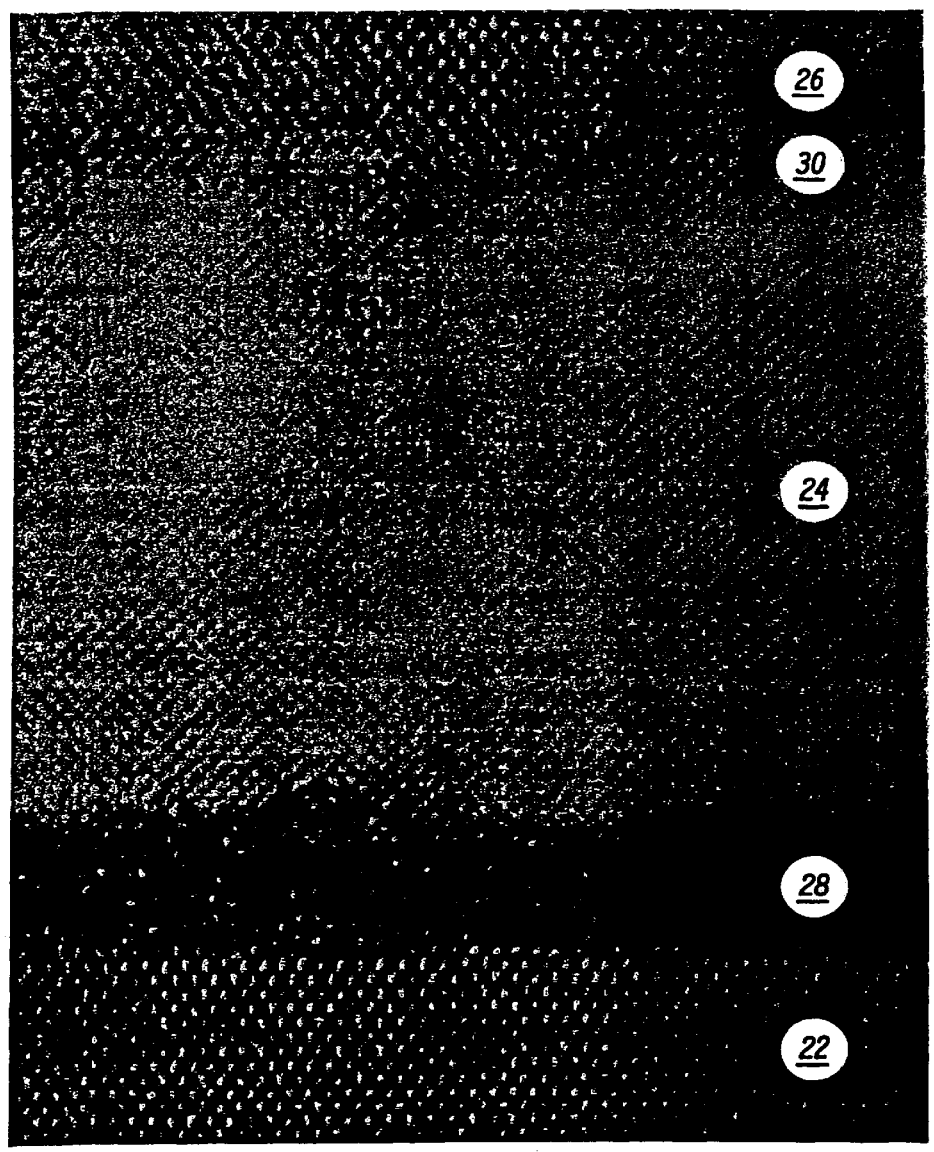
FIG. 5 illustrates a high resolution Transmission Electron Micrograph of a structure including a monocrystalline accommodating buffer layer.

FIG. 5 is a high resolution Transmission Electron Micrograph (TEM) of semiconductor material manufactured in accordance with one embodiment of the present invention. Single crystal SrTiO$_3$ accommodating buffer layer 24 was grown epitaxially on silicon substrate 22. During this growth process, amorphous interfacial layer 28 is formed which relieves strain due to lattice mismatch. GaAs compound semiconductor layer 26 was then grown epitaxially using template layer 30.

Figure 6:
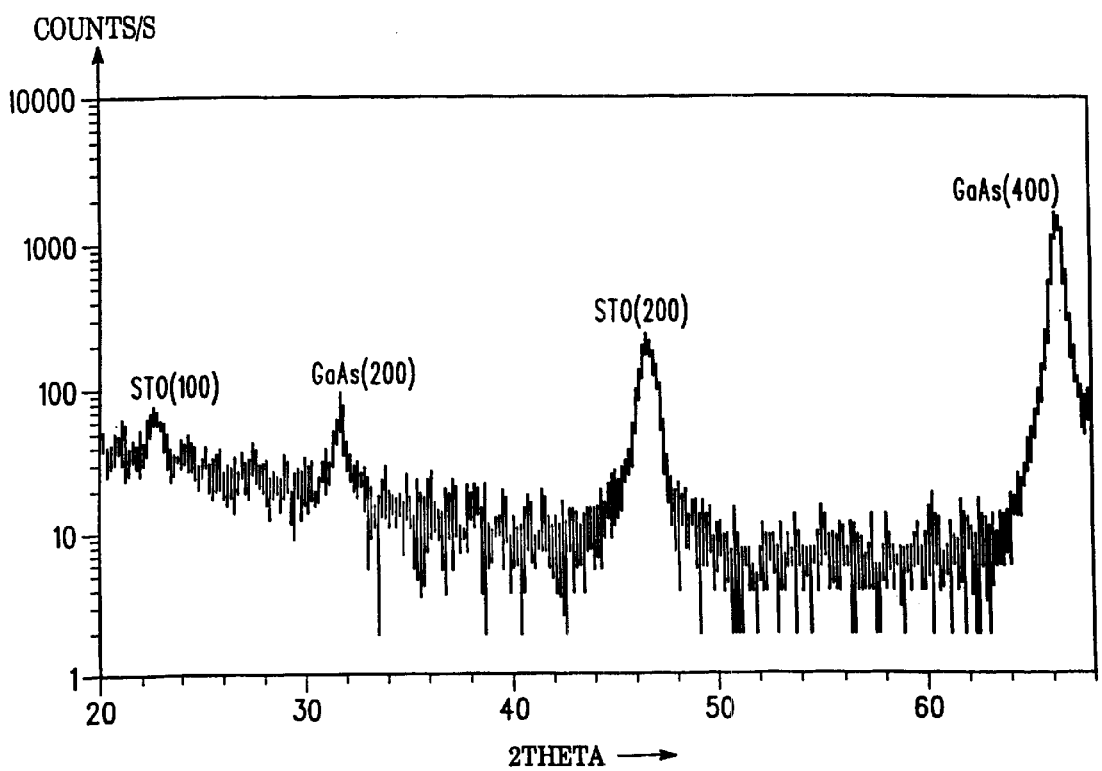
FIG. 6 illustrates an x-ray diffraction spectrum of a structure including a monocrystalline accommodating buffer layer.

FIG. 6 illustrates an x-ray diffraction spectrum taken on a structure including GaAs monocrystalline layer 26 comprising GaAs grown on silicon substrate 22 using accommodating buffer layer 24. The peaks in the spectrum indicate that both the accommodating buffer layer 24 and GaAs compound semiconductor layer 26 are single crystal and (100) orientated.

The structure illustrated in FIG. 2 can be formed by the process discussed above with the addition of an additional buffer layer deposition step. The additional buffer layer 32 is formed overlying the template layer before the deposition of the monocrystalline material layer. If the buffer layer is a monocrystalline material comprising a compound semiconductor superlattice, such a superlattice can be deposited, by MBE for example, on the template described above. If instead the buffer layer is a monocrystalline material layer comprising a layer of germanium, the process above is modified to cap the strontium titanate monocrystalline layer with a final layer of either strontium or titanium and then by depositing germanium to react with the strontium or titanium. The germanium buffer layer can then be deposited directly on this template.

Structure 34, illustrated in FIG. 3, may be formed by growing an accommodating buffer layer, forming an amorphous oxide layer over substrate 22, and growing semiconductor layer 38 over the accommodating buffer layer, as described above. The accommodating buffer layer and the amorphous oxide layer are then exposed to an anneal process sufficient to change the crystalline structure of the accommodating buffer layer from monocrystalline to amorphous, thereby forming an amorphous layer such that the combination of the amorphous oxide layer and the now amorphous accommodating buffer layer form a single amorphous oxide layer 36. Layer 26 is then subsequently grown over layer 38. Alternatively, the anneal process may be carried out subsequent to growth of layer 26.

In accordance with one aspect of this embodiment, layer 36 is formed by exposing substrate 22, the accommodating buffer layer, the amorphous oxide layer, and monocrystalline layer 38 to a rapid thermal anneal process with a peak temperature of about 700° C. to about 1000° C. and a process time of about 5 seconds to about 10 minutes. However, other suitable anneal processes may be employed to convert the accommodating buffer layer to an amorphous layer in accordance with the present invention. For example, laser annealing, electron beam annealing, or "conventional" thermal annealing processes (in the proper environment) may be used to form layer 36. When conventional thermal annealing is employed to form layer 36, an overpressure of one or more constituents of layer 30 may be required to prevent degradation of layer 38 during the anneal process. For example, when layer 38 includes GaAs, the anneal environment preferably includes an overpressure of arsenic to mitigate degradation of layer 38.

As noted above, layer 38 of structure 34 may include any materials suitable for either of layers 32 or 26. Accordingly, any deposition or growth methods described in connection with either layer 32 or 26, may be employed to deposit layer 38.

Figure 7:
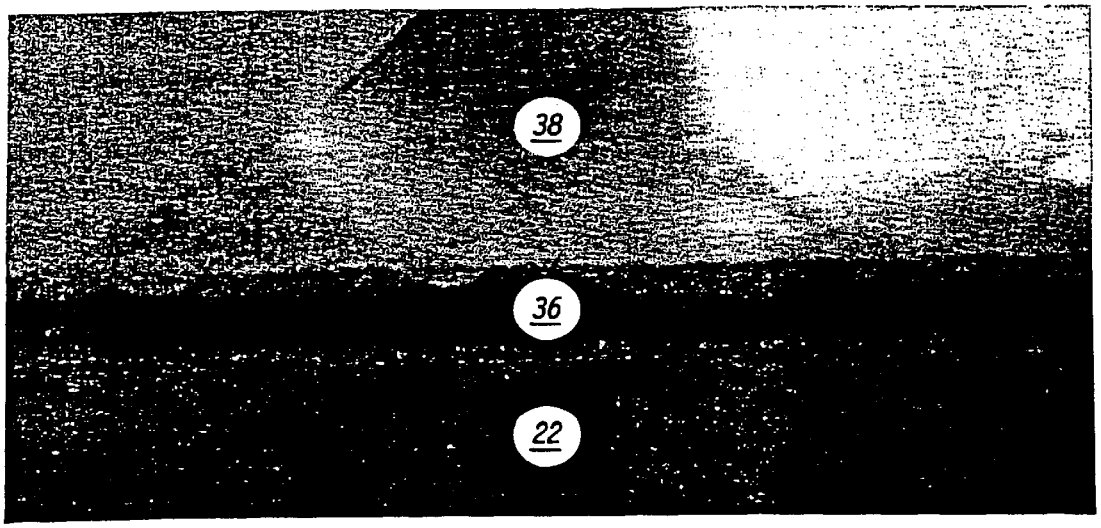
FIG. 7 illustrates a high resolution Transmission Electron Micrograph of a structure including an amorphous oxide layer.

FIG. 7 is a high resolution TEM of semiconductor material manufactured in accordance with the embodiment of the invention illustrated in FIG. 3. In accordance with this embodiment, a single crystal SrTiO$_3$ accommodating buffer layer was grown epitaxially on silicon substrate 22. During this growth process, an amorphous interfacial layer forms as described above. Next, additional monocrystalline layer 38 comprising a compound semiconductor layer of GaAs is formed above the accommodating buffer layer and the accommodating buffer layer is exposed to an anneal process to form amorphous oxide layer 36.

Figure 8:
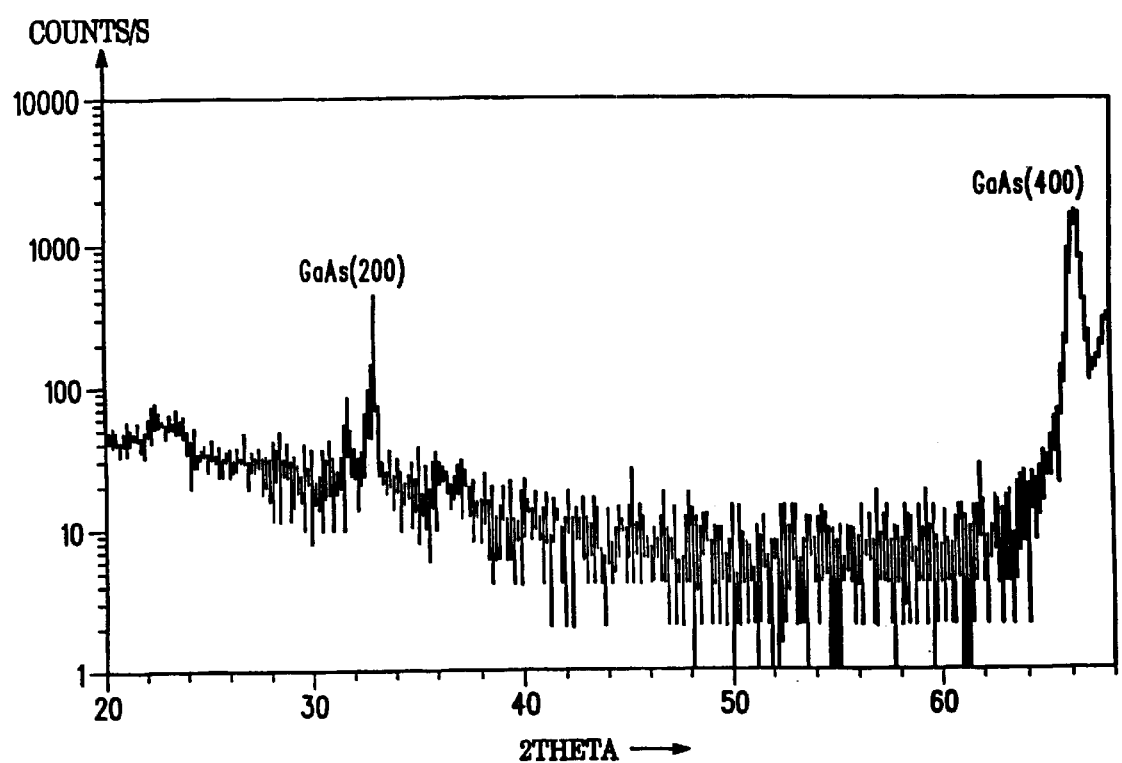
FIG. 8 illustrates an x-ray diffraction spectrum of a structure including an amorphous oxide layer.

FIG. 8 illustrates an x-ray diffraction spectrum taken on a structure including additional monocrystalline layer 38 comprising a GaAs compound semiconductor layer and amorphous oxide layer 36 formed on silicon substrate 22. The peaks in the spectrum indicate that GaAs compound semiconductor layer 38 is single crystal and (100) orientated and the lack of peaks around 40 to 50 degrees indicates that layer 36 is amorphous.

The process described above illustrates a process for forming a semiconductor structure including a silicon substrate, an overlying oxide layer, and a monocrystalline material layer comprising a gallium arsenide compound semiconductor layer by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, other monocrystalline accommodating buffer layers such as alkaline earth metal titanates, zirconates, hafnates, tantalates, vanadates, ruthenates, and niobates, alkaline earth metal tin-based perovskites, lanthanum aluminate, lanthanum scandium oxide, and gadolinium oxide can also be grown. Further, by a similar process such as MBE, other monocrystalline material layers comprising other III–V and II–VI monocrystalline compound semiconductors, semiconductors, metals and non-metals can be deposited overlying the monocrystalline oxide accommodating buffer layer.

Each of the variations of monocrystalline material layer and monocrystalline oxide accommodating buffer layer uses an appropriate template for initiating the growth of the monocrystalline material layer. For example, if the accommodating buffer layer is an alkaline earth metal zirconate, the oxide can be capped by a thin layer of zirconium. The deposition of zirconium can be followed by the deposition of arsenic or phosphorus to react with the zirconium as a precursor to depositing indium gallium arsenide, indium aluminum arsenide, or indium phosphide respectively. Similarly, if the monocrystalline oxide accommodating buffer layer is an alkaline earth metal hafnate, the oxide layer can be capped by a thin layer of hafnium. The deposition of hafnium is followed by the deposition of arsenic or phosphorous to react with the hafnium as a precursor to the growth of an indium gallium arsenide, indium aluminum arsenide, or indium phosphide layer, respectively. In a similar manner, strontium titanate can be capped with a layer of strontium or strontium and oxygen and barium titanate can be capped with a layer of barium or barium and oxygen. Each of these depositions can be followed by the deposition of arsenic or phosphorus to react with the capping material to form a template for the deposition of a monocrystalline material layer comprising compound semiconductors such as indium gallium arsenide, indium aluminum arsenide, or indium phosphide.

The formation of a device structure in accordance with another embodiment of the invention is illustrated schematically in cross-section in FIGS. 9–12. Like the previously described embodiments referred to in FIGS. 1–3, this embodiment of the invention involves the process of forming a compliant substrate utilizing the epitaxial growth of single crystal oxides, such as the formation of accommodating buffer layer 24 previously described with reference to FIGS. 1 and 2 and amorphous layer 36 previously described with reference to FIG. 3, and the formation of a template layer 30. However, the embodiment illustrated in FIGS. 9–12 utilizes a template that includes a surfactant to facilitate layer-by-layer monocrystalline material growth.

Figure 9:
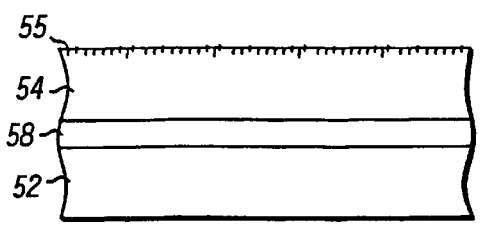
FIGS. 9–12 illustrate schematically, in cross-section, the formation of a device structure in accordance with another embodiment of the invention.

Turning now to FIG. 9, an amorphous interface layer 58 is formed on substrate 52 at the interface between substrate 52 and a growing accommodating buffer layer 54, which is preferably a monocrystalline crystal oxide layer, by the oxidation of substrate 52 during the growth of layer 54. Layer 54 is preferably a monocrystalline oxide material such as a monocrystalline layer of $Sr_zBa_{1-z}TiO_3$ where z ranges from 0 to 1. However, layer 54 may also comprise any of those compounds previously described with reference layer 24 in FIGS. 1–2 and any of those compounds previously described with reference to layer 36 in FIG. 3 which is formed from layers 24 and 28 referenced in FIGS. 1 and 2.

Figure 10:
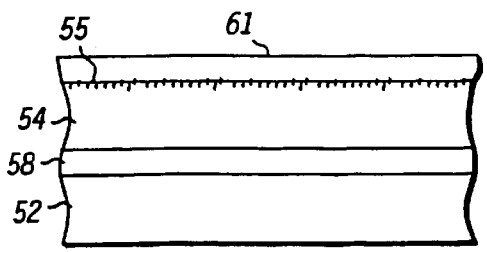
Figure 11:
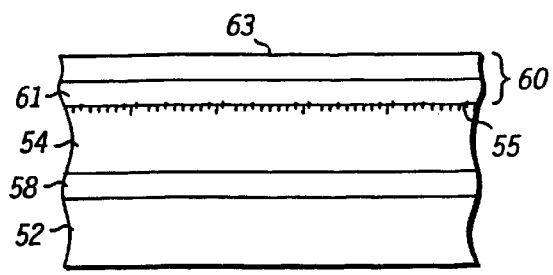

Layer 54 is grown with a strontium (Sr) terminated surface represented in FIG. 9 by hatched line 55 which is followed by the addition of a template layer 60 which includes a surfactant layer 61 and capping layer 63 as illustrated in FIGS. 10 and 11. Surfactant layer 61 may comprise, but is not limited to, elements such as Al, In and Ga, but will be dependent upon the composition of layer 54 and the overlying layer of monocrystalline material for optimal results. In one exemplary embodiment, aluminum (Al) is used for surfactant layer 61 and functions to modify the surface and surface energy of layer 54. Preferably, surfactant layer 61 is epitaxially grown, to a thickness of one to two monolayers, over layer 54 as illustrated in FIG. 10 by way of molecular beam epitaxy (MBE), although other epitaxial processes may also be performed including chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like.

Surfactant layer 61 is then exposed to a Group V element such as arsenic, for example, to form capping layer 63 as illustrated in FIG. 11. Surfactant layer 61 may be exposed to a number of materials to create capping layer 63 such as elements which include, but are not limited to, As, P, Sb and N. Surfactant layer 61 and capping layer 63 combine to form template layer 60.

Figure 12:
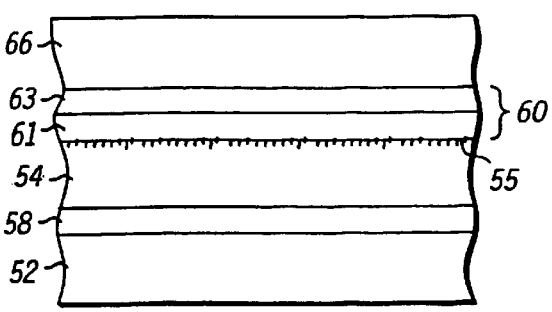

Monocrystalline material layer 66, which in this example is a compound semiconductor such as GaAs, is then deposited via MBE, CVD, MOCVD, MEE, ALE, PVD, CSD, PLD, and the like to form the final structure illustrated in FIG. 12.

FIGS. 13–16 illustrate possible molecular bond structures for a specific example of a compound semiconductor structure formed in accordance with the embodiment of the invention illustrated in FIGS. 9–12. More specifically, FIGS. 13–16 illustrate the growth of GaAs (layer 66) on the strontium terminated surface of a strontium titanate monocrystalline oxide (layer 54) using a surfactant containing template (layer 60).

The growth of a monocrystalline material layer 66 such as GaAs on an accommodating buffer layer 54 such as a strontium titanium oxide over amorphous interface layer 58 and substrate layer 52, both of which may comprise materials previously described with reference to layers 28 and 22, respectively in FIGS. 1 and 2, illustrates a critical thickness of about 1000 Angstroms where the two-dimensional (2D) and three-dimensional (3D) growth shifts because of the surface energies involved. In order to maintain a true layer by layer growth (Frank Van der Merwe growth), the following relationship must be satisfied:

$$\delta_{STO} > (\delta_{INT} + \delta_{GaAs})$$

where the surface energy of the monocrystalline oxide layer 54 must be greater than the surface energy of the amorphous interface layer 58 added to the surface energy of the GaAs layer 66. Since it is impracticable to satisfy this equation, a surfactant containing template was used, as described above with reference to FIGS. 10–12, to increase the surface energy of the monocrystalline oxide layer 54 and also to shift the crystalline structure of the template to a diamond-like structure that is in compliance with the original GaAs layer.

Figure 13:
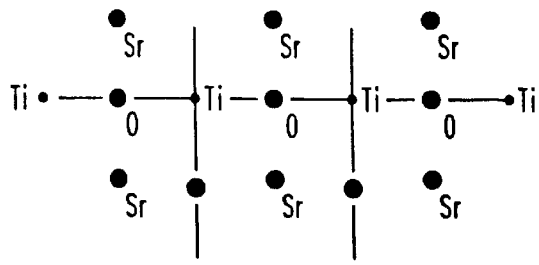
FIGS. 13–16 illustrate a probable molecular bonding structure of the device structures illustrated in FIGS. 9–12.
Figure 14:
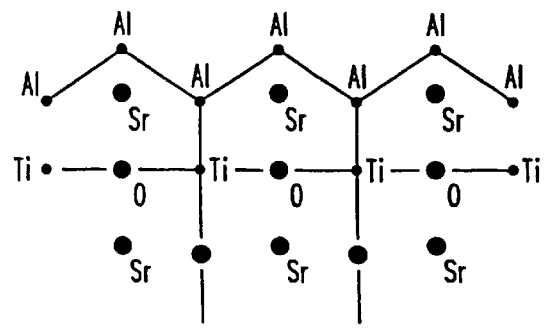
Figure 15:
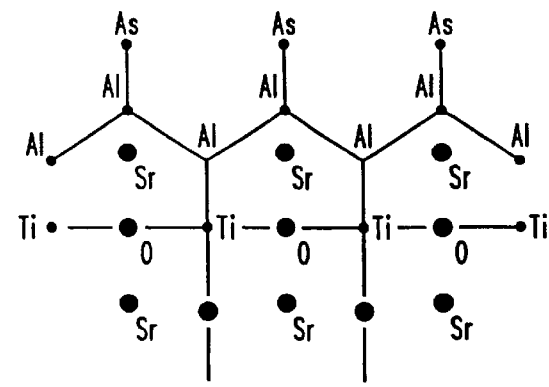
Figure 16:
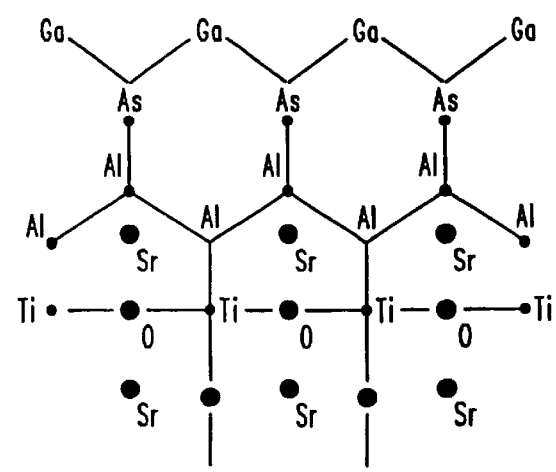

FIG. 13 illustrates the molecular bond structure of a strontium terminated surface of a strontium titanate monocrystalline oxide layer. An aluminum surfactant layer is deposited on top of the strontium terminated surface and bonds with that surface as illustrated in FIG. 14, which reacts to form a capping layer comprising a monolayer of $Al_2Sr$ having the molecular bond structure illustrated in FIG. 14 which forms a diamond-like structure with an $sp^3$ hybrid terminated surface that is compliant with compound semiconductors such as GaAs. The structure is then exposed to As to form a layer of AlAs as shown in FIG. 15. GaAs is then deposited to complete the molecular bond structure illustrated in FIG. 16 which has been obtained by 2D growth. The GaAs can be grown to any thickness for forming other semiconductor structures, devices, or integrated circuits. Alkaline earth metals such as those in Group IIA are those elements preferably used to form the capping surface of the monocrystalline oxide layer 54 because they are capable of forming a desired molecular structure with aluminum.

In this embodiment, a surfactant containing template layer aids in the formation of a compliant substrate for the monolithic integration of various material layers including those comprised of Group III–V compounds to form high quality semiconductor structures, devices and integrated circuits. For example, a surfactant containing template may be used for the monolithic integration of a monocrystalline material layer such as a layer comprising Germanium (Ge), for example, to form high efficiency photocells.

Turning now to FIGS. 17–20, the formation of a device structure in accordance with still another embodiment of the invention is illustrated in cross-section. This embodiment utilizes the formation of a compliant substrate which relies on the epitaxial growth of single crystal oxides on silicon followed by the epitaxial growth of single crystal silicon onto the oxide.

Figure 17:
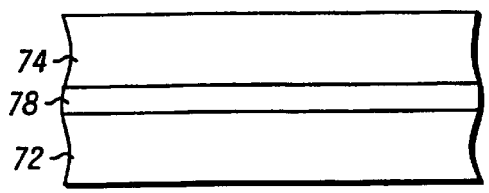
FIGS. 17–20 illustrate schematically, in cross-section, the formation of a device structure in accordance with still another embodiment of the invention.

An accommodating buffer layer 74 such as a monocrystalline oxide layer is first grown on a substrate layer 72, such as silicon, with an amorphous interface layer 78 as illustrated in FIG. 17. Monocrystalline oxide layer 74 may be comprised of any of those materials previously discussed with reference to layer 24 in FIGS. 1 and 2, while amorphous interface layer 78 is preferably comprised of any of those materials previously described with reference to the layer 28 illustrated in FIGS. 1 and 2. Substrate 72, although preferably silicon, may also comprise any of those materials previously described with reference to substrate 22 in FIGS. 1–3.

Figure 18:
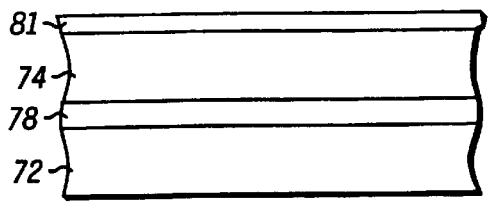

Next, a silicon layer 81 is deposited over monocrystalline oxide layer 74 via MBE, CVD, MOCVD, MEE, ALE, PVD, CSD, PLD, and the like as illustrated in FIG. 18 with a thickness of a few hundred Angstroms but preferably with a thickness of about 50 Angstroms. Monocrystalline oxide layer 74 preferably has a thickness of about 20 to 100 Angstroms.

Figure 19:
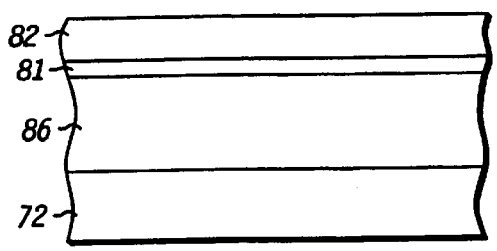
Figure 20:
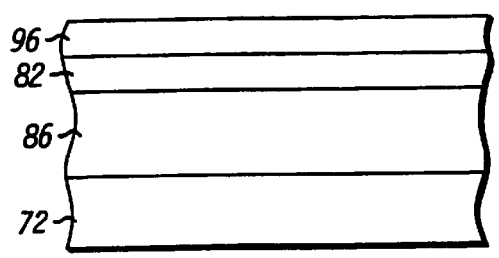

Rapid thermal annealing is then conducted in the presence of a carbon source such as acetylene or methane, for example at a temperature within a range of about 800_C to 1000_C to form capping layer 82 and silicate amorphous layer 86. However, other suitable carbon sources may be used as long as the rapid thermal annealing step functions to amorphize the monocrystalline oxide layer 74 into a silicate amorphous layer 86 and carbonize the top silicon layer 81 to form capping layer 82 which in this example would be a silicon carbide (SiC) layer as illustrated in FIG. 19. The formation of amorphous layer 86 is similar to the formation of layer 36 illustrated in FIG. 3 and may comprise any of those materials described with reference to layer 36 in FIG. 3 but the preferable material will be dependent upon the capping layer 82 used for silicon layer 81.

Finally, a compound semiconductor layer 96, such as gallium nitride (GaN) is grown over the SiC surface by way of MBE, CVD, MOCVD, MEE, ALE, PVD, CSD, PLD, or the like to form a high quality compound semiconductor material for device formation. More specifically, the deposition of GaN and GaN based systems such as GaInN and AlGaN will result in the formation of dislocation nets confined at the silicon/amorphous region. The resulting nitride containing compound semiconductor material may comprise elements from groups III, IV and V of the periodic table and is defect free.

Although GaN has been grown on SiC substrate in the past, this embodiment of the invention possesses a one step formation of the compliant substrate containing a SiC top surface and an amorphous layer on a Si surface. More specifically, this embodiment of the invention uses an intermediate single crystal oxide layer that is amorphized to form a silicate layer which adsorbs the strain between the layers. Moreover, unlike past use of a SiC substrate, this embodiment of the invention is not limited by wafer size which is usually less than 50 mm in diameter for prior art SiC substrates.

The monolithic integration of nitride containing semiconductor compounds containing group III–V nitrides and silicon devices can be used for high temperature RF applications and optoelectronics. GaN systems have particular use in the photonic industry for the blue/green and UV light sources and detection. High brightness light emitting diodes (LEDs) and lasers may also be formed within the GaN system.

Figure 21:
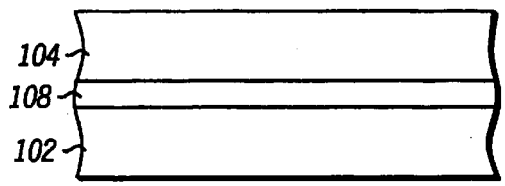
FIGS. 21–23 illustrate schematically, in cross-section, the formation of yet another embodiment of a device structure in accordance with the invention.
Figure 22:
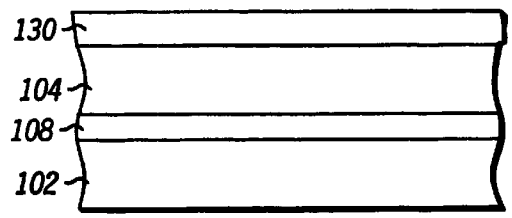
Figure 23:
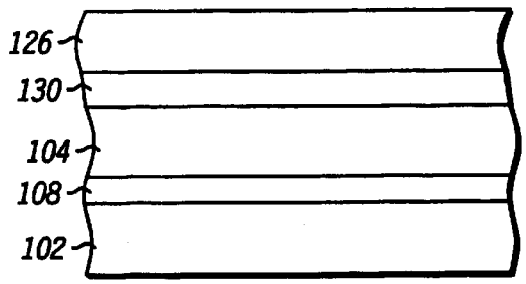

FIGS. 21–23 schematically illustrate, in cross-section, the formation of another embodiment of a device structure in accordance with the invention. This embodiment includes a compliant layer that functions as a transition layer that uses clathrate or Zintl type bonding. More specifically, this embodiment utilizes an intermetallic template layer to reduce the surface energy of the interface between material layers thereby allowing for two dimensional layer by layer growth.

The structure illustrated in FIG. 21 includes a monocrystalline substrate 102, an amorphous interface layer 108 and an accommodating buffer layer 104. Amorphous interface layer 108 is formed on substrate 102 at the interface between substrate 102 and accommodating buffer layer 104 as previously described with reference to FIGS. 1 and 2. Amorphous interface layer 108 may comprise any of those materials previously described with reference to amorphous interface layer 28 in FIGS. 1 and 2. Substrate 102 is preferably silicon but may also comprise any of those materials previously described with reference to substrate 22 in FIGS. 1–3.

A template layer 130 is deposited over accommodating buffer layer 104 as illustrated in FIG. 22 and preferably comprises a thin layer of Zintl type phase material composed of metals and metalloids having a great deal of ionic character. As in previously described embodiments, template layer 130 is deposited by way of MBE, CVD, MOCVD, MEE, ALE, PVD, CSD, PLD, or the like to achieve a thickness of one monolayer. Template layer 130 functions as a "soft" layer with non-directional bonding but high crystallinity which absorbs stress build up between layers having lattice mismatch. Materials for template 130 may include, but are not limited to, materials containing Si, Ga, In, and Sb such as, for example, $AlSr_2$, $(MgCaYb)Ga_2$, $(Ca,Sr,Eu,Yb)In_2$, $BaGe_2As$, and $SrSn_2As_2$ A monocrystalline material layer 126 is epitaxially grown over template layer 130 to achieve the final structure illustrated in FIG. 23. As a specific example, an $SrAl_2$ layer may be used as template layer 130 and an appropriate monocrystalline material layer 126 such as a compound semiconductor material GaAs is grown over the $SrAl_2$. The Al—Ti (from the accommodating buffer layer of layer of $Sr_zBa_{1-z}TiO_3$ where z ranges from 0 to 1) bond is mostly metallic while the Al—As (from the GaAs layer) bond is weakly covalent. The Sr participates in two distinct types of bonding with part of its electric charge going to the oxygen atoms in the lower accommodating buffer layer 104 comprising $Sr_zBa_{1-z}TiO_3$ to participate in ionic bonding and the other part of its valence charge being donated to Al in a way that is typically carried out with Zintl phase materials. The amount of the charge transfer depends on the relative electronegativity of elements comprising the template layer 130 as well as on the interatomic distance. In this example, Al assumes an $sp^3$ hybridization and can readily form bonds with monocrystalline material layer 126, which in this example, comprises compound semiconductor material GaAs.

The compliant substrate produced by use of the Zintl type template layer used in this embodiment can absorb a large strain without a significant energy cost. In the above example, the bond strength of the Al is adjusted by changing the volume of the $SrAl_2$ layer thereby making the device tunable for specific applications which include the monolithic integration of III–V and Si devices and the monolithic integration of high-k dielectric materials for CMOS technology.

Clearly, those embodiments specifically describing structures having compound semiconductor portions and Group IV semiconductor portions, are meant to illustrate embodiments of the present invention and not limit the present invention. There are a multiplicity of other combinations and other embodiments of the present invention. For example, the present invention includes structures and methods for fabricating material layers which form semiconductor structures, devices and integrated circuits including other layers such as metal and non-metal layers. More specifically, the invention includes structures and methods for forming a compliant substrate which is used in the fabrication of semiconductor structures, devices and integrated circuits and the material layers suitable for fabricating those structures, devices, and integrated circuits. By using embodiments of the present invention, it is now simpler to integrate devices that include monocrystalline layers comprising semiconductor and compound semiconductor materials as well as other material layers that are used to form those devices with other components that work better or are easily and/or inexpensively formed within semiconductor or compound semiconductor materials. This allows a device to be shrunk, the manufacturing costs to decrease, and yield and reliability to increase.

In accordance with one embodiment of this invention, a monocrystalline semiconductor or compound semiconductor wafer can be used in forming monocrystalline material layers over the wafer. In this manner, the wafer is essentially a "handle" wafer used during the fabrication of semiconductor electrical components within a monocrystalline layer overlying the wafer. Therefore, electrical components can be formed within semiconductor materials over a wafer of at least approximately 200 millimeters in diameter and possibly at least approximately 300 millimeters.

By the use of this type of substrate, a relatively inexpensive "handle" wafer overcomes the fragile nature of compound semiconductor or other monocrystalline material wafers by placing them over a relatively more durable and easy to fabricate base material. Therefore, an integrated circuit can be formed such that all electrical components, and particularly all active electronic devices, can be formed within or using the monocrystalline material layer even though the substrate itself may include a monocrystalline semiconductor material. Fabrication costs for compound semiconductor devices and other devices employing non-silicon monocrystalline materials should decrease because larger substrates can be processed more economically and more readily compared to the relatively smaller and more fragile substrates (e.g. conventional compound semiconductor wafers).

One advantage to the semiconductor structures discussed thus far is that they allow semiconductors to integrate the superior properties of compound semiconductors with the well established technology of silicon. One problem associated with the growth of compound semiconductors on silicon, however, is the growth of polar on nonpolar semiconductor structures. Epitaxial growth of polar semiconductors on nonpolar substrates often leads to structural defects known as anti-phase domains (or anti-phase boundaries) due to constituent atoms occupying incorrect sublattices. More particularly, anti-phase domains are charged structural defects which make epitaxial layers of the semiconductor structure behave like highly compensated semiconductors, which in turn degrade the performance of the devices fabricated on the semiconductor structure. One reason this degradation in performance occurs is due to the presence of steps in the layer surfaces of the semiconductor structure.

Figure 24:
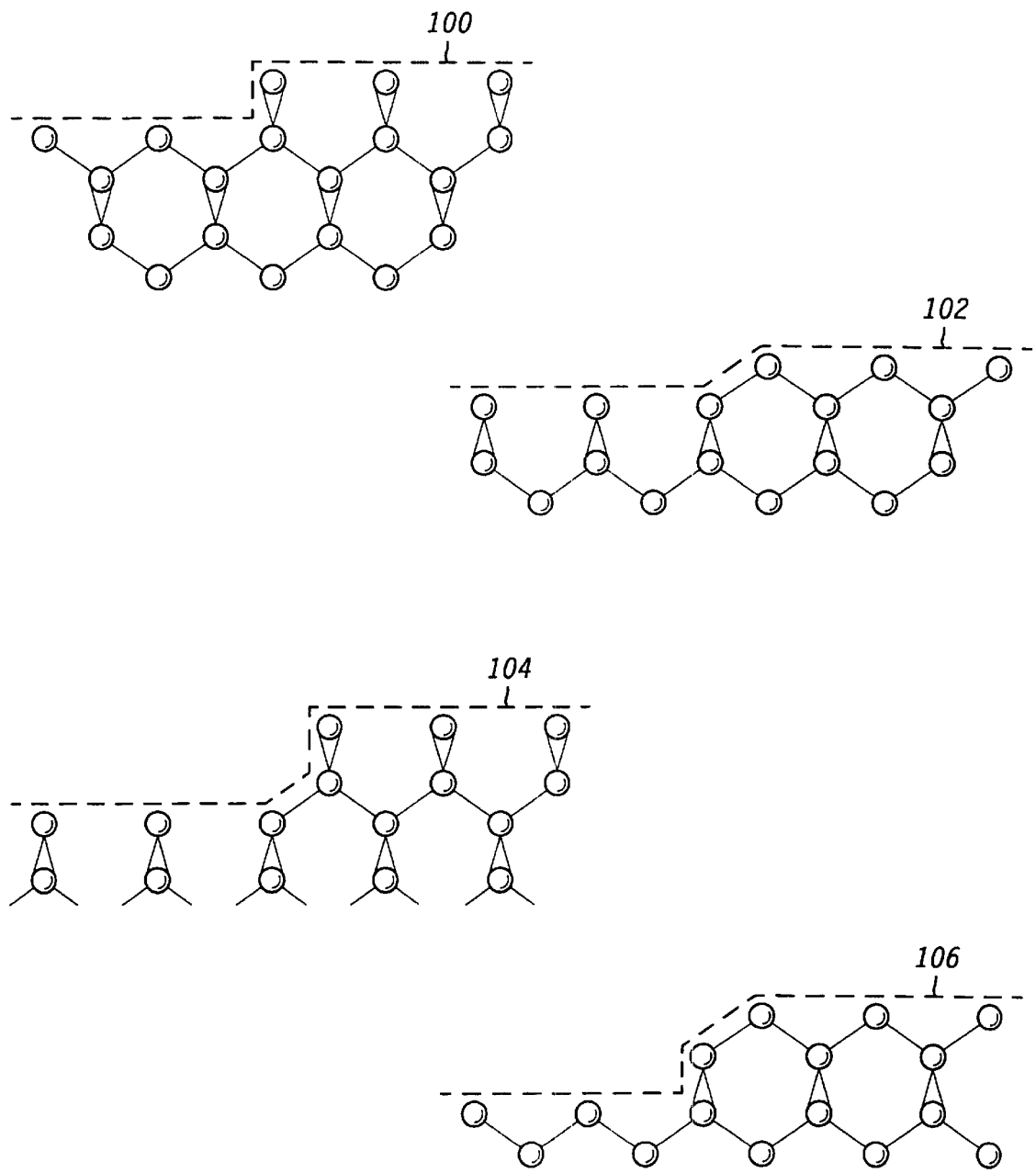
FIG. 24 is a simplified side view illustrating four different step configurations for a layer surface.

The layer surfaces of most semiconductors contain steps in the atomic scale which lead to the presence of anti-phase domains. Surface steps in semiconductors can be steps of odd atomic layers (single steps) or even atomic layers (double steps), and may take one of four different configurations. FIG. 24 illustrates four different step configurations, which include two types of single steps, steps 100 and 102, and two types of double steps, 104 and 106. Most layer surfaces have a mixture of single and double steps, however, double step 106 is energetically favored over the other steps because it requires less energy to form. This is advantageous because singles steps often are the cause of antiphase domains. For example, in a semiconductor having the compound semiconductor gallium arsenide epitaxially grown on silicon, the presence of steps may result in gallium forming the initial layer on some areas of silicon substrate and arsenic on the rest of the substrate surface. In such cases, the first monoatomic layer will be part gallium and part arsenic, thereby creating anti-phase domains. These anti-phase domains may be avoided by ensuring that the steps present in the layer surfaces are double steps rather than single steps.

Figure 25:
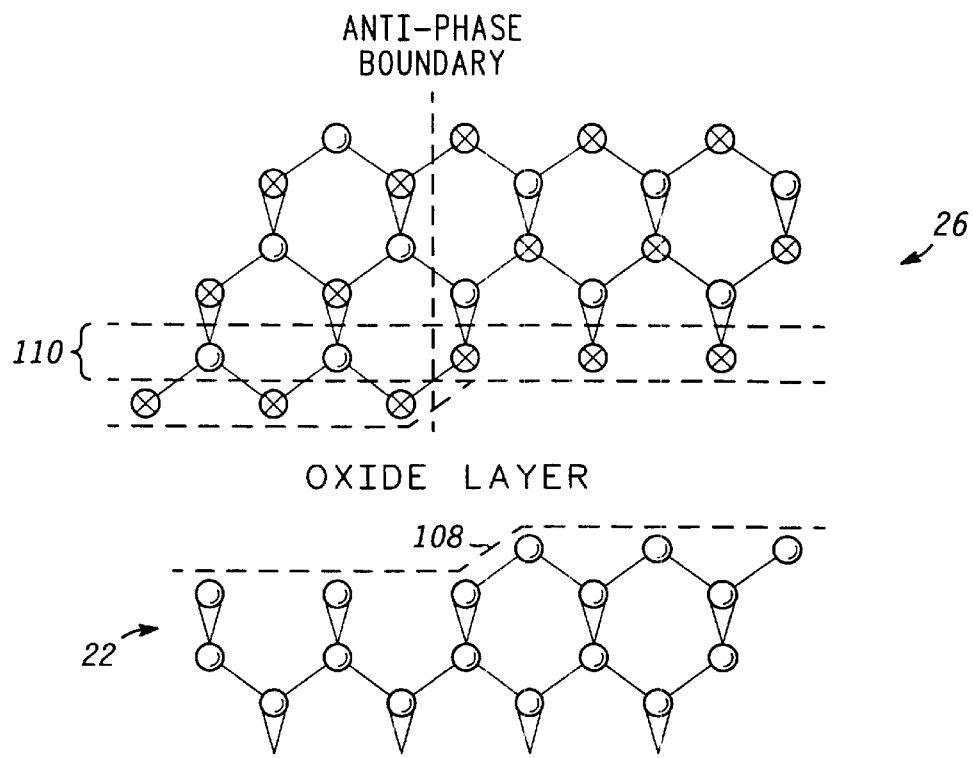
FIGS. 25 and 26 illustrate the difference between single and double steps and indicate where anti-phase domains occur in single steps (FIG. 25).
Figure 26:
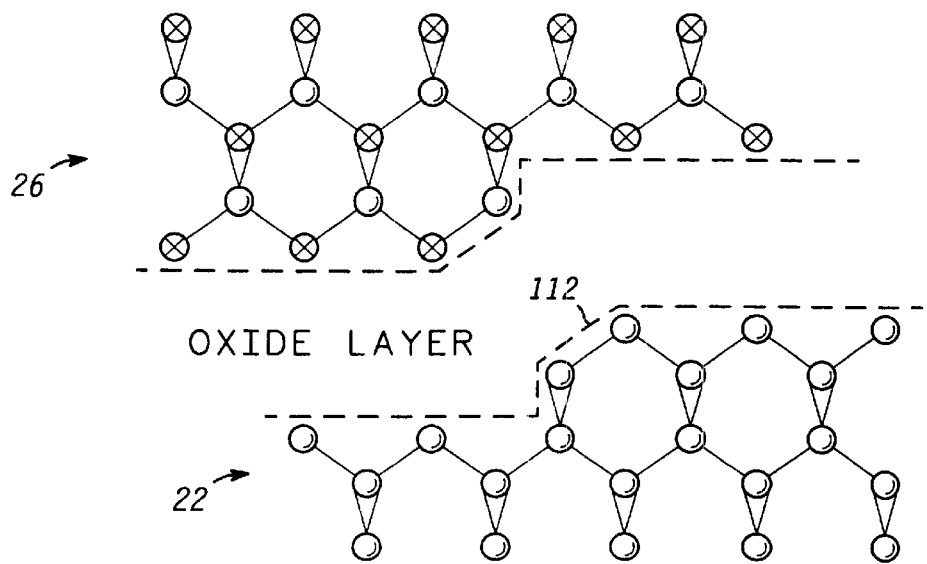

FIGS. 25 and 26 illustrate the difference between single and double steps and indicate where anti-phase domains occur with respect to single steps. In FIGS. 25 and 26, an amorphous oxide layer (labeled "OXIDE" in FIGS. 25 and 26) is grown on a monocrystalline substrate 22, as described above, and a compound semiconductor layer 26 is then epitaxially applied to the amorphous oxide layer. In FIG. 25, the substrate 22 has a single step 108 which causes a mismatch in the monoatomic layer 110 of the compound semiconductor material, thereby creating an anti-phase boundary beginning (as shown by the vertical dotted line) at the point where the layer atoms switch from one atom type to another and ending (not shown) where the layer atoms switch back to the original atom type. In FIG. 26, the double step 112 allows the atoms of the compound semiconductor to adjust according to the step without creating a mismatch in the monoatomic layers. When all of the layers are made up uniformly of like atoms, the layer has achieved what is referred to as a primitive surface.

In order to control or suppress the presence of anti-phase domains, the single steps may be induced into rearranging themselves into double steps via a thermal treatment such as thermal annealing at a temperature greater than approximately 1000° C. (which is to say that this thermal treatment can be effective up to several hundred degrees above 1000° C., and several tens of degrees below 1000° C., depending on other variables such as the rate of temperature change and duration at the raised temperature)

During the thermal treatment, π-bonded reconstruction occurs at the step edges and the energetically less favorable step edge diffuses towards the energetically more favorable step edge, (e.g., the single steps form double steps). Once the double steps are formed, the surface becomes primitive (i.e., single steps are suppressed or essentially eliminated) and the semiconductor structure operates without the degradation brought about by the presence of a significant quantity of anti-phase domains.

Referring is now made to the semiconductor structures discussed above in which a compound semiconductor such as gallium arsenide (GaAs) is grown on an oxide interface such as strontium titanate ($SrTiO_3$) over a monocrystalline substrate such as silicon (Si). A silicon substrate is thermally treated to induce the single steps present on the silicon substrate's surface to rearrange themselves into double steps. A perovskite oxide film is then grown on the silicon over an amorphous layer, as described above, and the surface of the perovskite oxide film mimics the step structure of the silicon surface. Thus the perovskite oxide film will have double steps corresponding to the double steps in the silicon. By rearranging the steps into double steps, the potential anti-phase domains which may have occurred at the single step locations will effectively be suppressed.

The steps on the perovskite layer determine how the compound semiconductor grows and may or may not get amorphized due to heat treatment. If single steps are translated from the Si surface to the oxide interface, anti-phase domain disorders may occur when the compound gallium arsenide (GaAs) layer is grown on the oxide interface layer.

More particularly, a staking fault may occur due to the different size lattices of Si and $SrTiO_3$, translating the step from the Si to the oxide interface. Accordingly adjacent terraces will have mismatching atoms and anti-phase domains, while every other terrace will have matching atoms. To overcome the degradation associated with the presence of anti-phase domains, the Si substrate is heat treated to suppress or essentially eliminate single steps and form double steps which can transition to the oxide interface layer grown on the Si and the compound semiconductor layer grown on the oxide interface. The minimization of single steps will allow the semiconductor structure to operate without the deleterious effects of a significant quantity of anti-phase domains.

In addition, the anti-phase domains may be suppressed by pre-exposing the layer to be covered to a monoatomic layer an element of the monocrystalline compound semiconductor for an amount of time adequate to ensure uniform coverage of the layer to be covered. For example, if gallium arsenide is being grown on an oxide interface as discussed above, the oxide interface layer could be pre-exposed to either a layer of gallium or arsenic for an adequate time to ensure uniform coverage of the oxide interface layer. A tilted substrate may be used to ensure double steps are formed instead of single steps and the semiconductor structure operates essentially without anti-phase domain driven degradation. This is because a substrate formed at a small off angle forms with a large preponderance of double steps compared to single steps (and perhaps has no single steps).

Figure 27:
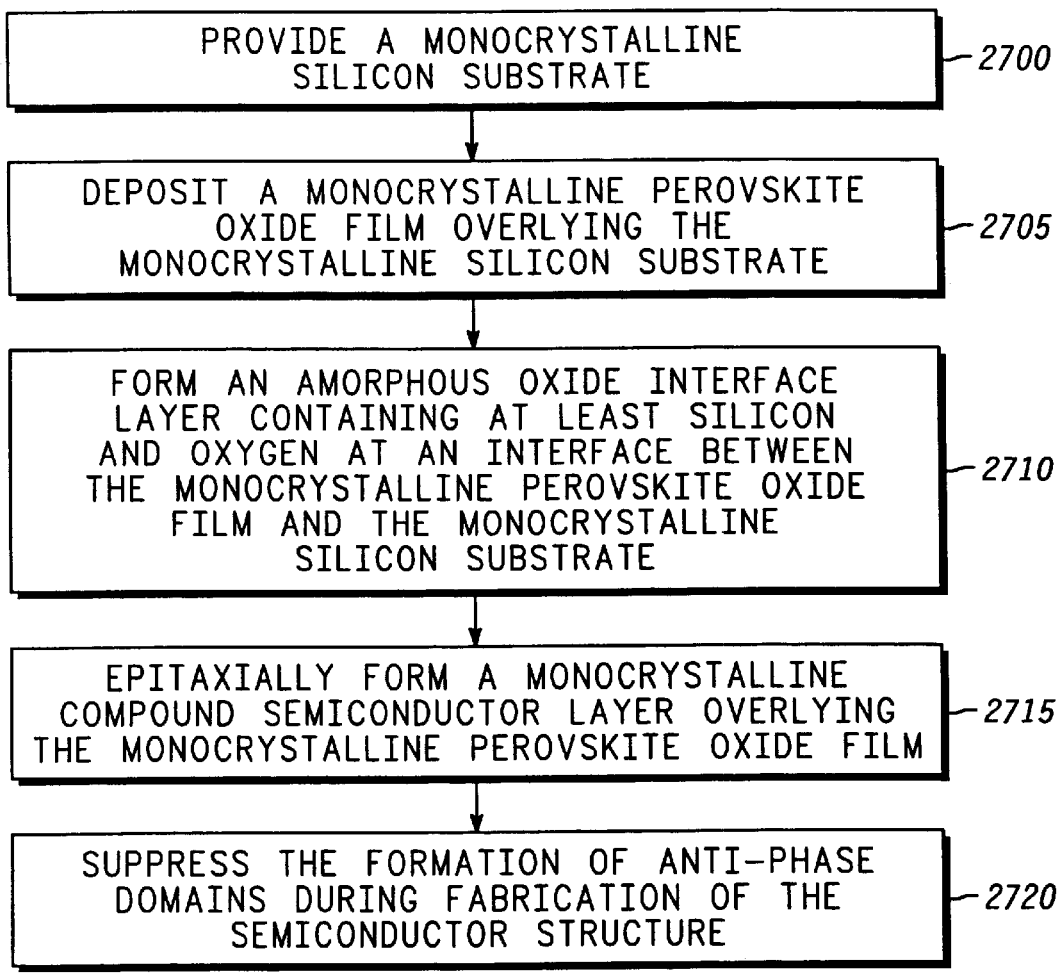
FIG. 27 is a flow chart showing some steps of a process for fabricating a semiconductor structure capable of controlling anti-phase domains.

Referring now to FIG. 27, a flow chart shows some steps of a process for fabricating a semiconductor structure capable of controlling anti-phase domains in the semiconductor structure, using the techniques described in this disclosure. Some steps that have been described herein above and some steps that are obvious to one of ordinary skill in the art are not shown in the flow chart, but would be used to fabricate the semiconductor. At step 2700, a monocrystalline silicon substrate is provided, meaning that the substrate is prepared for use in equipment that is used in the next step of the process. A monocrystalline perovskite oxide film is deposited overlying the monocrystalline silicon substrate at step 2705, the film having a thickness less than a thickness of the material that would result in strain-induced defects. An amorphous oxide interface layer is formed at step 2710, containing at least silicon and oxygen at an interface between the monocrystalline perovskite oxide film and the monocrystalline silicon substrate. At step 2715, a monocrystalline compound semiconductor layer is epitaxially formed overlying the monocrystalline perovskite oxide film. Formation of anti-phase domains is suppressed at step 2720 during fabrication of the semiconductor structure. The suppression may be accomplished by heat treating and/or using a substrate that is at a slight off-angle, as described herein above.

The preceding description uses gallium arsenide grown on an oxide interface and silicon as an example and the figures depict a downward step in the layer surfaces, however, one of ordinary skill in the art should recognize that the procedure discussed herein can be applied using various elements and that layer surface steps may be upward steps or a mixture of upward and downward steps. For example, one of ordinary skill in the art should recognize that the amorphous interface layer may be exposed to any combination of elements from Group III and Group V elements as a compound semiconductor.

Thus it is seen that a semiconductor structure that provides a high quality monocrystalline film or layer over another monocrystalline material is provided that is capable of controlling anti-phase domains in the semiconductor structure. One skilled in the art will appreciate that the present invention can be practiced by other than the described embodiments, which are presented for purposes of illustration and not of limitation, and the present invention is limited only by the claims which follow.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for fabricating a semiconductor structure capable of controlling antiphase domains in the semiconductor structure, the method comprising:

providing a monocrystalline silicon substrate;

depositing a monocrystalline perovskite oxide film overlying the monocrystalline silicon substrate, the film having a thickness less than a thickness of the material that would result in strain-induced defects;

forming an amorphous oxide interface layer containing at least silicon and oxygen at an interface between the monocrystalline perovskite oxide film and the monocrystalline silicon substrate;

epitaxially forming a monocrystalline compound semiconductor layer overlying the monocrystalline perovskite oxide film; and suppressing the formation of anti-phase domains during fabrication of the semiconductor structure.

2. The method according to claim 1, wherein the anti-phase domains are suppressed by heat treating the monocrystalline silicon substrate to form double steps from single steps, thereby avoiding anti-phase domains in the semiconductor structure.

3. The method according to claim 2, wherein the heat treating is performed at a temperature greater than approximately 1000° C.

4. The method according to claim 3, wherein the anti-phase domains are suppressed by transferring the double steps formed in the substrate to the oxide interface layer.

5. The method according to claim 1, wherein the anti-phase domains are suppressed by:

pre-exposing the amorphous oxide interface layer to a monoatomic layer of the monocrystalline compound semiconductor for an amount of time adequate to ensure uniform coverage of the amorphous oxide interface layer; and using a tilted substrate to ensure formation of a preponderance of double steps compared to single steps.

6. A method for fabricating a semiconductor structure capable of controlling anti-phase domains in the semiconductor structure, the method comprising:

providing a monocrystalline silicon substrate;

depositing a monocrystalline perovskite oxide film overlying the monocrystalline silicon substrate, the film having a thickness less than a thickness of the material that would result in strain-induced defects;

forming an amorphous oxide interface layer containing at least silicon and oxygen at an interface between the monocrystalline perovskite oxide film and the monocrystalline silicon substrate;

epitaxially forming a monocrystalline compound semiconductor layer overlying the monocrystalline perovskite oxide film; and inducing double step formation during the fabrication of the semiconductor structure to reduce single steps, thereby controlling anti-phase domains in the semiconductor structure.

7. The method according to claim 6, wherein the double step formation is induced by heat treating the monocrystalline silicon substrate before the perovskite oxide film is deposited.

8. The method according to claim 6, wherein a transference of the double steps to the surface of the perovskite oxide film occurs during the deposition of the pervoskite oxide film.

* * * * *